US010591568B2

(12) United States Patent
Rehwald et al.

(10) Patent No.: US 10,591,568 B2
(45) Date of Patent: Mar. 17, 2020

(54) SYSTEMS AND METHODS FOR PHASE-SENSITIVE INVERSION RECOVERY MR IMAGING WITH REDUCED SENSITIVITY TO CARDIAC MOTION

(71) Applicants: Siemens Healthcare GmbH, Erlangen (DE); Duke University, Durham, NC (US)

(72) Inventors: Wolfgang G. Rehwald, Chapel Hill, NC (US); David C. Wendell, Durham, NC (US); Elizabeth R. Jenista, Durham, NC (US); Enn-Ling Chen, Chapel Hill, NC (US); Raymond J. Kim, Chapel Hill, NC (US)

(73) Assignees: Siemens Healthcare GmbH, Erlangen (DE); Duke University, Durham, NC (US)

( * ) Notice: Subject to any disclaimer, the term of this patent is extended or adjusted under 35 U.S.C. 154(b) by 258 days.

(21) Appl. No.: 15/623,511

(22) Filed: Jun. 15, 2017

(65) Prior Publication Data
US 2018/0203086 A1     Jul. 19, 2018

Related U.S. Application Data

(60) Provisional application No. 62/446,027, filed on Jan. 13, 2017.

(51) Int. Cl.
*G01R 33/563* (2006.01)
*G01R 33/56* (2006.01)
(Continued)

(52) U.S. Cl.
CPC ..... *G01R 33/5635* (2013.01); *G01R 33/4818* (2013.01); *G01R 33/5602* (2013.01);
(Continued)

(58) Field of Classification Search
USPC .................................................. 324/300–322
See application file for complete search history.

(56) References Cited

U.S. PATENT DOCUMENTS 9,131,870 B2   9/2015  Kim
2011/0263970 A1*  10/2011  Xu ...................... A61B 5/055
                                                                600/419

(Continued)

FOREIGN PATENT DOCUMENTS

JP        2006-81704      *  3/2006  ............ G01R 33/54
WO    WO2014072867 A1    5/2014

OTHER PUBLICATIONS

Simonetti, Orlando P., et al. "An improved MR imaging technique for the visualization of myocardial infarction." Radiology 218.1 (2001): 215-223.
(Continued)

*Primary Examiner* — Jay Patidar

(57) ABSTRACT

A magnetic resonance imaging system and method are provided for improved phase-sensitive magnetic resonance imaging of tissues affected by cardiovascular pulsatile motion. A magnetically-prepared image dataset and corresponding reference image dataset (for phase sensitivity) are obtained within the duration of a single cardiac cycle. The paired datasets can be single-shot or segmented datasets and a navigator sequence can optionally be provided with each paired dataset. The system and method take advantage of the shape symmetry of the cardiac cycle to acquire the paired dataset in a shorter time interval, thereby reducing misregistration artifacts. The magnetic preparation can include inversion recovery pulses, FIDDLE sequences, other magnetic preparation sequences, or combinations thereof. The reference dataset can be acquired at a lower resolution than the corresponding magnetically-prepared dataset without compromising image quality.

28 Claims, 13 Drawing Sheets

(51) Int. Cl.
*G01R 33/567* (2006.01)
*G01R 33/565* (2006.01)
*G01R 33/48* (2006.01)

(52) U.S. Cl.
CPC ..... *G01R 33/5673* (2013.01); *G01R 33/5676* (2013.01); *G01R 33/56509* (2013.01); *G01R 33/56325* (2013.01)

(56) References Cited

U.S. PATENT DOCUMENTS

| | | | | |
|---|---|---|---|---|
| 2012/0068704 | A1* | 3/2012 | Popescu | G01R 33/4835 324/309 |
| 2013/0194265 | A1* | 8/2013 | Rehwald | G01R 33/4828 345/424 |
| 2013/0274592 | A1* | 10/2013 | Shin | A61B 5/055 600/420 |
| 2015/0077106 | A1* | 3/2015 | Kim | G01R 33/4828 324/309 |
| 2015/0223703 | A1* | 8/2015 | Abd-Elmoniem | A61B 5/7207 600/413 |
| 2015/0374237 | A1* | 12/2015 | Hu | A61B 5/055 600/413 |
| 2019/0064299 | A1* | 2/2019 | Botnar | G01R 33/5673 |

OTHER PUBLICATIONS

Kellman, Peter, et al. "Phase-sensitive inversion recovery for detecting myocardial infarction using gadolinium-delayed hyperenhancement." Magnetic resonance in medicine 47.2 (2002): 372-383.
Jenista, Elizabeth R., et al. "Motion and flow insensitive adiabatic T2-preparation module for cardiac MR imaging at 3 tesla." Magnetic resonance in medicine 70.5 (2013): 1360-1368.
Xue, Hui, et al. "Motion correction for myocardial T1 mapping using image registration with synthetic image estimation." Magnetic resonance in medicine 67.6 (2012): 1644-1655.
Abdula, Goran, et al. "Synthetic phase sensitive inversion recovery late gadolinium enhancement from post-contrast T1-mapping shows excellent agreement with conventional PSIR-LGE for diagnosing myocardial scar." Journal of Cardiovascular Magnetic Resonance 16.1 (2014): P213.
Wang, Jinnan, et al. "Referenceless Acquisition of Phase-sensitive Inversion-recovery with Decisive reconstruction (RAPID) imaging." Magnetic resonance in medicine 72.3 (2014): 806-815.
Wang, J., R. Bastkowski, and P. Boemert Enhancing Referenceless Phase Sensitive Reconstruction using Geometry Based B0 simulation in ISMRM. 2015.
Tisdall, Dylan, and M. Stella Atkins. "MRI denoising via phase error estimation." Proc. of SPIE vol. vol. 5747. 2005.
Tisdall, M. Dylan, and M. Stella Atkins. "Using human and model performance to compare MRI reconstructions." IEEE transactions on medical imaging 25.11 (2006): 1510-1517.
MacFall, James R., Norbert J. Pelc, and Robert M. Vavrek. "Correction of spatially dependent phase shifts for partial Fourier imaging." Magnetic resonance imaging 6.2 (1988): 143-155.

* cited by examiner

PRIOR ART

IR IMAGE (PRIOR ART)

PRIOR ART

PSIR IMAGE (PRIOR ART)

PRIOR ART

SYSTEMS AND METHODS FOR PHASE-SENSITIVE INVERSION RECOVERY MR IMAGING WITH REDUCED SENSITIVITY TO CARDIAC MOTION

CROSS-REFERENCE TO RELATED APPLICATION(S)

The present application relates to and claims priority from U.S. Provisional Patent Application Ser. No. 62/446,027 filed on Jan. 13, 2017, the disclosure of which is incorporated herein by reference in its entirety.

FIELD OF THE DISCLOSURE

The present disclosure relates to a method and a system for providing improved phase-sensitive inversion recovery (PSIR) magnetic resonance imaging including, more specifically, improved PSIR imaging of tissue affected by cardiovascular pulsatile motion.

BACKGROUND INFORMATION

Magnetic resonance (MR) imaging is a known technology that can produce images of the inside of an examination subject without radiation exposure. In a typical MR imaging procedure, the subject is positioned in a strong, static, homogeneous base magnetic field B0 (having a field strength that is typically between about 0.5 Tesla and 3 Tesla) in an MR apparatus, so that the subject's nuclear spins become oriented along the base magnetic field.

Radio-frequency (RF) excitation pulses are directed into the examination subject to excite nuclear magnetic resonances, and subsequent relaxation of the excited nuclear magnetic resonances can generate RF signals. Rapidly switched magnetic gradient fields can be superimposed on the base magnetic field, in various orientations, to provide spatial coding of the RF signal data (also referred to as image data). The RF signal data can be detected during a 'readout' phase, and mathematically processed to reconstruct images of the examination subject. For example, the acquired RF signal data are typically digitized and stored as complex numerical values in a k-space matrix. An associated MR image can be reconstructed from the k-space matrix populated with such values using a multi-dimensional Fourier transformation.

One use of magnetic resonance imaging is to visualize myocardial damage in the setting of heart disease. Inversion-recovery (IR) and phase-sensitive inversion-recovery (PSIR) techniques, described in more detail below, can be used to visualize myocardial infarction and scar tissue in the setting of ischemic and non-ischemic heart disease. These techniques are also referred to as myocardial delayed enhancement (MDE) or late Gadolinium enhancement (LGE) sequences, and are widely used in clinical MRI.

Inversion recovery (IR) imaging is an MR technique that can provide T1 contrast between different tissue types. A conventional IR pulse sequence is shown in FIG. 2. In the IR sequence, an IR pulse (that is typically spatially and chemically non-selective), at the time labeled IR in FIG. 2, inverts longitudinal magnetization $M_z$ of different tissue types, e.g., from +M0 to −M0. This may be done in the presence or absence of a T1-shortening contrast agent. The magnetization recovery (e.g., relaxation of the inverted magnetization from −M0 towards +M0) is different in each tissue type. For example, the species of primary interest in cardiac MRI are typically normal myocardium, infarcted myocardium (infarct), and blood. These different tissue types are often referred to as 'species.' T1 shortening contrast agents can optionally be introduced into the subject prior to the imaging procedure to improve contrast. The recovery rate of a particular species can be represented as the inverse of its longitudinal recovery time T1. For example, in FIG. 2, it can be seen that the longitudinal magnetization $M_z$ of infarct tissue relaxes back to +M0 in a shorter time (i.e., with a shorter T1 value) than normal myocardium tissue, which has a longer T1 value.

A time delay TI is inserted between the IR pulse and the data acquisition sequence, such that the magnetization of one of the species (e.g., normal myocardium in the specific case of cardiac MRI) is approximately zero at the time of acquisition. This is often referred to as 'nulling' the particular species, and can generate improved T1 image contrast between the nulled species and other tissue types. For example, in FIG. 2, the normal myocardium magnetization recovery curve (shown as a dashed curved line) goes through zero at time TI after the initial inversion pulse (e.g., at or near the center of the inversion data acquisition sequence).

The scanner operator can set the so-called inversion time (TI) for the species to be nulled, which represents a time interval between the IR pulse and a time within the readout sequence where the image-contrast-relevant raw data is collected as illustrated, e.g., in FIG. 2. The TI shown in FIG. 2 effectively nulls the normal myocardium tissue such that it has essentially zero longitudinal magnetization, whereas the infarct and blood magnetizations (each of which has a shorter T1) have recovered to a greater degree and have positive M0 values at time TI following the IR pulse. In the exemplary IR image of a portion of a heart shown in FIG. 3 (with a TI set to the optimal TI time shown in FIG. 2), normal myocardium appears dark and infarct tissue appears bright.

In FIG. 2, the normal myocardium magnetization recovery curve shown in dashed line goes through zero at approximately the center of the raw data acquisition following the inversion pulse. This conventional sequence for acquiring raw IR image data is also referred to herein as an "inversion recovery data acquisition" or IR-DA. The optimal/"correct" TI value nulls normal myocardium during the IR-DA and, due to the shorter T1 of the infarct and blood, those species recover faster towards M0 (the initial baseline magnetization) and have a positive value at time TI following the IR pulse.

IR MR images are typically magnitude images, meaning the image pixels do not have a sign associated with them, even though the detected magnetization has a sign. Magnetizations with opposite polarity (sign) but the same magnitude appear with the same brightness in the in the MR image. For example, if TI were set at the time with poor infarct imaging denoted in FIG. 2, the infarct would appear black (having zero magnetization) and the normal myocardium would appear grey, having a moderate negative magnetization. Such inverted or 'wrong' image contrast can occur if the time delay between IR and data readout is set too short. More importantly, if TI were set between the two time values shown in FIG. 2 (e.g. between the 'poor' infarct imaging and the optimal time), there would be very little contrast between normal myocardium and infarct in the resulting IR image. For example, if normal myocardium has a slightly negative magnetization and infarct has a slightly positive magnetization at the selected TI, both types of tissue would appear as similar grey regions in an IR image because an IR image does not differentiate between positive and negative magnetizations. Accordingly, use of an incorrect TI value can result in uninterpretable or misinterpreted clinical images.

In cardiovascular imaging, the image data for a single MR image can take some time to be collected. Because the heart is beating and undergoes significant shape changes as it beats, cardiovascular images are often obtained by 'triggering' (also referred to as 'gating') a data collection sequence in sync with the heartbeat. This is often done using an electrocardiogram (ECG) signal, which detects the electrical activity of the heart. The electrical pulse peak that triggers the heart to begin a heartbeat is referred to as an R-wave. The time between consecutive R-waves can be referred to as a cardiac cycle, having the duration of a single heartbeat, and may be abbreviated as RR.

The pulsatile flow of blood from the heart with each heartbeat can also affect the shape and location of tissues outside the heart. For example, the aorta changes noticeably in shape and location during the cardiac cycle. The systems and methods described herein are therefore not limited to imaging cardiac tissue, but can also be used for extracardiac tissues that are affected by the periodic pulsatile motion of blood.

A schematic illustration of a conventional triggered IR data acquisition sequence is shown in FIG. 4. The upper squiggly line represents the ECG signal, with the R-wave pulses denoted by R. The interval labeled RR between consecutive R-waves represents a single cardiac cycle. In such triggered data acquisitions, the IR pulse (an RF pulse that typically inverts the magnetization of all tissues in the region or volume being imaged) is provided at some point in the cardiac cycle. Following a time delay TI, the inversion recovery data acquisition sequence (IR-DA) is performed, as also shown in FIG. 2. Additional IR data generation/acquisition sequences are also shown in the third and fifth cardiac cycles of FIG. 4. 'Blank' cardiac cycles containing no IR pulses or IR-DA sequences (e.g., the second and fourth RR cycles in FIG. 4) are typically provided as a delay between successive IR-pulse cycles to allow for further recovery of the magnetization before additional image data is obtained.

In this conventional cardiac triggered imaging sequence, the IR pulse is generated at a fixed interval following an R-wave, and the IR-DA sequence also occurs at a fixed interval following the R-wave when obtaining data for a single image over multiple cardiac cycles. The fraction of an interval between successive R-waves is commonly referred to as a cardiac 'phase'; e.g., the midpoint between two R-waves can define a particular cardiac phase, the point in time that is ⅓ of the way between an R-wave and the next R-wave can represent another phase, etc. Such phases are substantially independent of the actual duration of the R-R interval (e.g., independent of the specific heartbeat rate), and can represent a particular shape configuration of the heart as it cycles through the repeated beating process.

In cardiac imaging, image datasets are typically obtained for a particular phase over a plurality of cardiac cycles so that the heart, which is rhythmically moving during the cardiac cycles, will have the same "shape" during each IR-DA sequence. Without such timing, different IR-DA sequences that are used to reconstruct a single image may obtain image data when the heart has different shapes within the cyclical heartbeat sequences, leading to corrupted image data. Similarly, pulsatile blood motion may lead to different locations and/or shapes of extra-cardiac tissues throughout the cardiac cycle. Thus, appropriate cardiac timing may be desirable to accurately image extra-cardiac tissues, such as the vasculature and other organs, which are affected by the blood motion or by the pulsing heart itself. Without such timing and triggered data acquisition, image data may be corrupted due to cardiac-induced motion of the imaged tissues.

Normal breathing by the subject or other bodily movement while MR image data is being collected can also lead to image corruption, because the region being imaged can move relative to the MRI apparatus. One technique to reduce such unwanted motion is a simple 'breath-hold' technique where the subject is instructed to hold their breath during the imaging procedure, to reduce or eliminate motion of the diaphragm and chest cavity. If the subject's breath can be held for several heartbeats, image data can be obtained that is not affected by motion of the diaphragm. However, many subjects do not hold their breath perfectly and a small non-negligible diaphragmatic drift may occur, leading to motion-based image corruption. Additionally, involuntary swallowing during a breath-hold can corrupt the images.

Another well-known technique for reducing the effects of subject motion during MR imaging involves the use of 'navigator' images, often referred to as 'navigators.' These navigators are typically single k-space lines acquired using "navigator echoes" or low-resolution images of a small portion of (or adjacent to) the region being imaged. Such navigators can be obtained at several points during the overall imaging sequence in a relatively short amount of time. Alignment of these navigator lines or images can be used to align the image data obtained temporally proximal to the navigators, which can provide a degree of correction when processing the image data for undesirable motion that occurred during image data acquisition.

The phase-sensitive inversion recovery technique (PSIR) was developed to overcome the non-linear relationship between magnetization and image brightness. PSIR is a common MR imaging pulse sequence and reconstruction technique that provides IR images with good T1 contrast, even if the inversion time TI between an IR pulse and the IR-DA data readout sequence has not been set optimally. This is an advantage over the standard IR sequence, where an incorrect TI value can result in poor image contrast or incorrect interpretations of clinical images. PSIR images may be ECG-triggered for cardiac imaging and for imaging of extra-cardiac tissues that are prone to have significant motion during the cardiac cycle due to pulsatile blood flow.

In PSIR, image pixel (or voxel) intensity is displayed on a grayscale where the maximum magnetization in the image dataset (typically infarcted myocardium when imaging the heart) is depicted as white in the acquired image, and the minimum magnetization in the image dataset (typically normal myocardium or a fluid with intrinsically long T1 value) is displayed as black. With PSIR image reconstruction, the phase information (+/− magnetization) is restored to the image by comparing changes in the phase of the image magnetization between paired (i.e., corresponding) image datasets. In practice, two paired datasets are acquired for each PSIR pulse sequence, the first of which is a conventional IR dataset (IR-DA), and the second being a reference phase MR dataset (REF). When the REF dataset is acquired, there is little or no perturbation to the longitudinal magnetization M0 of the imaged tissue resulting from a prior RF pulse (e.g., the tissue has substantially no magnetization preparation).

A schematic illustration of a conventional triggered PSIR data acquisition sequence is shown in FIG. 5. This is similar to the triggered IR sequence illustrated in FIG. 4, except that each IR pulse and subsequent IR-DA image data collection sequence is followed by a reference data collection sequence (REF) during the subsequent cardiac cycle.

An important aspect of the PSIR image reconstruction is spatial registration between the two datasets (IR-DA and REF), as corresponding pixels from both datasets are compared in order to restore the phase information. To minimize artifacts due to spatial misregistration, the two datasets are typically acquired in an identical manner. For segmented k-space acquisition, the identical portions of k-space are typically acquired during two consecutive heart beats at the same temporal window within the cardiac cycle (e.g., centered over the same cardiac phase as described earlier) for the IR-DA and REF datasets, and with identical spatial and temporal resolution. Thus, for cardiac imaging, the REF and IR-DA image datasets will correspond to the heart having the same shape as it cycles through periodic heartbeats. For extra-cardiac imaging, the REF and IR-DA image datasets will correspond to images of extra-cardiac tissues that are deformed in the same transient manner by pulsatile blood flow. As can be seen in FIG. 5, in a standard embodiment of PSIR, the time of two heartbeats is required to acquire the corresponding portions of both datasets.

FIG. 6 shows an exemplary PSIR image of the same cardiac location of the same patient as the IR image of FIG. 3. In this image, the infarct appears as bright white, with the normal myocardium being dark grey, such that the infarct can be clearly identified. Within a large range of TI values, the PSIR image will exhibit similar image contrast for cardiac tissues, because such contrast is based on the actual differences in magnetization for the various tissues, and not just on the differences in their magnitudes (or absolute values). In essence, PSIR imaging techniques provide a sign-corrected image that accounts for the polarity of the magnetization. Accordingly, the contrast in a PSIR image is much less sensitive to the selection of a particular TI value.

The PSIR magnetic resonance imaging technique can be implemented with both segmented and single shot readout schemes. In a segmented acquisition, the data acquisition for a single image is acquired as a plurality of portions (segments) of the image dataset that are distributed over multiple heart beats. The image data for each segment covers only a portion of k-space. The cardiac image shown in FIG. 6 is an example of an image reconstructed from a segmented PSIR acquisition. Each data segment is acquired as a paired segment, usually spanning two heart beats, with the latter part of each paired segment being a reference dataset (REF) used for phase identification as illustrated in FIG. 5. In a single shot acquisition, all IR image data are collected in one acquisition corresponding to a single readout train. In a subsequent heartbeat, all the reference data are acquired. As with the segmented implementation, both acquisitions (IR-DA and REF) are obtained during (e.g., the data acquisition sequence is centered at) the same cardiac phase (e.g., at the same time interval following the R-wave), but during consecutive heartbeats or cardiac cycles (as illustrated, e.g., in FIG. 5).

Conventional PSIR techniques, e.g., as illustrated in FIG. 5, are susceptible to imaging artifacts arising from spatial misregistration of the conventional data and reference phase data. Nonetheless, it is commonly assumed that by acquiring both datasets (IR-DA and REF) in an identical manner—e.g., in the same time point window within the cardiac cycle (centered over the same cardiac phase of two consecutive heart beats) and with the same spatial and temporal resolution—image artifacts are reduced to their lowest level, and that image artifacts would be worse if both datasets were not acquired in an identical manner. These common assumptions can lead to suboptimal clinical results in patients because of the extended time periods needed to obtain the PSIR paired datasets (especially when obtaining a plurality of such paired datasets in segmented acquisitions), which may introduce various motion artifacts during the extended imaging procedure.

Another limitation of conventional PSIR techniques is that they are not well-suited for single-shot imaging during free-breathing acquisitions. Some subjects have difficulty holding their breath and/or they may exhibit diaphragmatic drift; single-shot sequences can be helpful in reducing motion artifacts for such subjects as compared with segmented k-space acquisitions because of the shorter overall acquisition time needed. However, the requirement of acquiring two paired image datasets (IR-DA and REF) during PSIR imaging increases the likelihood of substantial breathing motion between the two datasets. Note that in single shot PSIR imaging, the IR-DA and corresponding REF image datasets are typically acquired two heartbeats (e.g. about 1.5 to 2 seconds) apart to allow for magnetization recovery after the magnetic saturation created by the long single-shot readout before acquiring the REF dataset. As a consequence, the final PSIR image can have motion artifacts due to spatial misregistration between IR-DA and REF datasets even though each of the two paired datasets was acquired in a single shot. Although moving the IR-DA and REF data acquisitions closer together in time could result in fewer motion artifacts, it is commonly thought that such a shortened interval is not possible in conventional PSIR imaging procedures because the two datasets need to be acquired at the same cardiac phase in separate heartbeats.

As noted earlier, a perfect breath hold can result in improved spatial registration of the IR-DA (inversion recovery) datasets and corresponding (paired) reference datasets in PSIR imaging when each dataset is acquired in the same cardiac phase, even though such paired dataset acquisition requires two separate cardiac cycles (heartbeats) as shown, e.g., in FIG. 5. Imperfect breath holds or free breathing imaging procedures, however, can lead to substantial shifts in cardiac position due to respiration-induced motion, thereby degrading spatial registration between the IR dataset and the corresponding reference dataset, leading to artifacts in the final PSIR image. In clinical practice, imperfect breath holds (or an inability to hold the breath for an extended period) are common, resulting in significant artifacts for the resulting PSIR images. Even when a subject can perform a perfect sustained breath hold, there may be ectopic heartbeats (such as a premature ventricular contraction) during the PSIR acquisition, which can also lead to spatial misregistration errors in the reconstructed PSIR image.

An important limitation of conventional PSIR techniques is that they are not well-suited for 3D (or 2D) respiratory-navigated procedures. In such imaging procedures, a respiratory navigator triggers the acquisition of image data. During a free-breathing respiratory-navigated sequence, respiratory navigators monitor the position of the diaphragm, and the associated acquired image data is only retained when the navigators determine the diaphragm is in the correct location.

In one type of respiratory-navigated PSIR, a single navigator is used for acquiring both datasets—the IR-DA dataset and the associated subsequent REF dataset. This approach can produce significant artifacts, because the reference dataset is usually acquired more than one second after the navigator data is acquired. If any motion of the subject occurs (e.g. breathing) between acquisitions of the IR-DA dataset and the reference dataset, spatial misregistration artifacts will occur even if the single navigator indicates that the image data is "good" data.

A second version of respiratory-navigated PSIR imaging uses a separate navigator for each of the inversion recovery and reference datasets. In principle, the addition of a second navigator can better account for the possibility of subject motion between the IR-DA and REF datasets. However, the need for a second navigator results in a significant lengthening of the overall scan time needed for data acquisition. Specifically, the scan time may be more than double that needed for data acquisition of a comparable 3D (or 2D) IR image without phase sensitivity information.

For example, the acquisition of paired datasets (e.g., a portion of k-space for segmented acquisitions, or 100% of k-space for single-shot acquisitions) during a PSIR imaging procedure will usually take far longer than two heartbeats because two distinct respiratory navigators have to accept data for the IR and reference datasets, respectively, and it is unlikely that the diaphragm will be in the same location for two consecutive heart beats. Scan times can become so excessive that this version of respiratory navigated PSIR is rarely attempted in clinical practice. To overcome this limitation, some navigated PSIR techniques do not navigate the reference data, assuming that the errors in misregistration will not greatly affect image quality. However, as discussed above, this assumption is usually invalid, and because of poor resulting image quality, this type of respiratory-navigated PSIR (with non-navigated reference datasets) is also rarely attempted in clinical practice.

Other techniques have been proposed for reducing the effects of respiratory or cardiac motion on MR image quality. For example, the so-called motion correction or "MOCO" technique does not reduce motion-related misregistration during image data acquisition, but instead attempts to compensate for such motion after the image data is obtained. This is achieved by post-processing, e.g., by non-rigid co-registration of images acquired during different parts of the respiratory cycle, cardiac cycle, or both. This technique works only with 2D datasets, and cannot correct for through-plane cardiac position shifts that typically occur with free breathing or poor breath-holding.

Accordingly, it would be desirable to have a system and method for magnetic resonance imaging that addresses some of the shortcomings described above, and that may further provide improved PSIR imaging of tissue affected by cardiovascular pulsatile motion by reducing the presence of motion artifacts and other dataset misregistration effects.

SUMMARY OF EXEMPLARY EMBODIMENTS

Exemplary embodiments of the present disclosure can provide a system and method for magnetic resonance (MR) imaging that can overcome limitations associated with standard phase-sensitive inversion recovery (PSIR) imaging techniques and similar MR imaging techniques by collecting paired reference and inversion recovery datasets within a shortened time frame. This can reduce spatial misregistration between the paired datasets for both segmented and single shot dataset acquisitions, and for acquisitions using or not using respiratory navigators. Further, scan times may be reduced for acquisitions using respiratory navigators.

In certain embodiments of the disclosure, a method for triggered cardiac PSIR imaging is provided in which the paired reference and inversion recovery (IR) datasets are acquired within the duration of a single cardiac cycle (e.g. the time between consecutive R-waves or heartbeats). In one embodiment, these two paired datasets are acquired within the same cardiac cycle, i.e., between two consecutive R-waves. In another embodiment, the two paired datasets are acquired over portions of two consecutive cardiac cycles but the total acquisition time for both datasets is still less than the duration of one RR-interval. Both paired datasets can be acquired when the heart is in the same shape, for example, immediately after the R-wave (late diastole) and during the mid-diastole phase.

In some embodiments, the reference image dataset is acquired prior to the associated (e.g., corresponding) IR image dataset. In other embodiments, the reference image dataset is acquired after the associated IR image dataset.

In further embodiments, each paired dataset produces a segment of the overall image data (e.g. data that covers a portion of k-space) for a reconstructed image. In still further embodiments, each paired dataset produces a single-shot dataset (e.g. image data that covers all of k-space) for imaging an entire slice or volume.

In still other embodiments, a saturation pulse sequence can be provided immediately before acquiring the reference dataset. In some embodiments, a navigator sequence can be provided with each set of paired (IR and reference) datasets.

In some embodiments of the disclosure, the data readout sequences can be gradient recalled echo (GRE) sequences. In other embodiments, the data readout sequences can be steady-state free precession (SSFP) sequences. In other embodiments, the data readout sequences can be either 2D or 3D. In still further embodiments, the imaging procedure can be a flow-independent dark-blood delayed enhancement (FIDDLE) imaging procedure.

In further embodiments of the disclosure, the reference image dataset can be acquired with a spatial or temporal resolution that is lower than that of the associated IR image dataset. In some embodiments, the reference image dataset can have a lower spatial resolution than the corresponding IR image dataset in the phase-encoding direction, in the frequency-encoding direction, or in both of these directions. In further embodiments, the spatial resolution of the reference image dataset can be one-half that of the corresponding IR image dataset in one or both of these directions.

In other embodiments, imaging procedures can be provided that include inversion magnetization preparations, T2 preparations, magnetization transfer preparations, T1-rho preparations, T2-rho preparations, other magnetization preparations for MR imaging, or combinations of such preparations. In still other embodiments of the disclosure, imaging procedures can be provided that include MOCO techniques and/or combinations of features of the various embodiments listed herein.

Embodiments of the disclosure can also provide a magnetic resonance imaging (MRI) system that is specifically configured to perform the imaging methods and procedures noted above, and combinations of such methods and procedures.

BRIEF DESCRIPTION OF THE DRAWINGS

Further objects, features and advantages of the present disclosure will become apparent from the following detailed description taken in conjunction with the accompanying figures showing illustrative embodiments, results and/or features of the exemplary embodiments of the present disclosure, in which.

Figure 1:
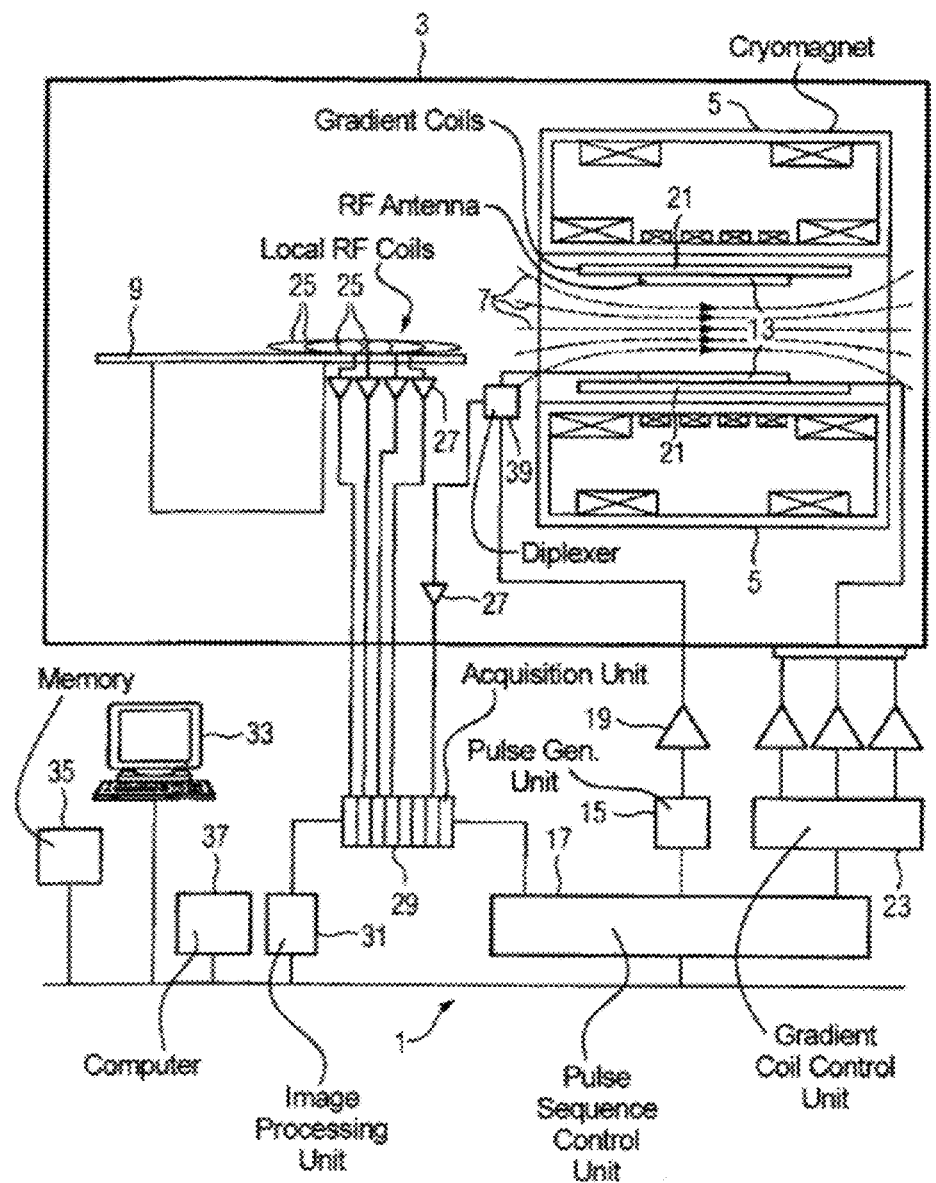
FIG. 1 schematically illustrates the basic components of a magnetic resonance imaging system constructed and operating in accordance with embodiments of the present disclosure.
Figure 2:
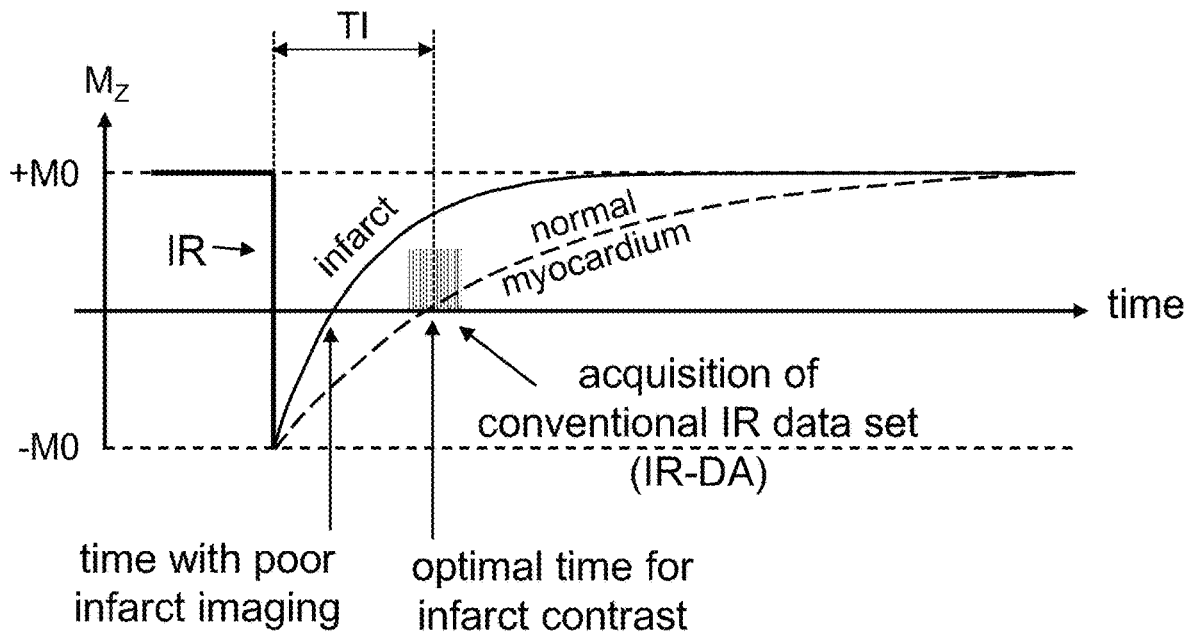
FIG. 2 is a schematic illustration of a conventional inversion recovery (IR) magnetic resonance imaging procedure.
Figure 3:
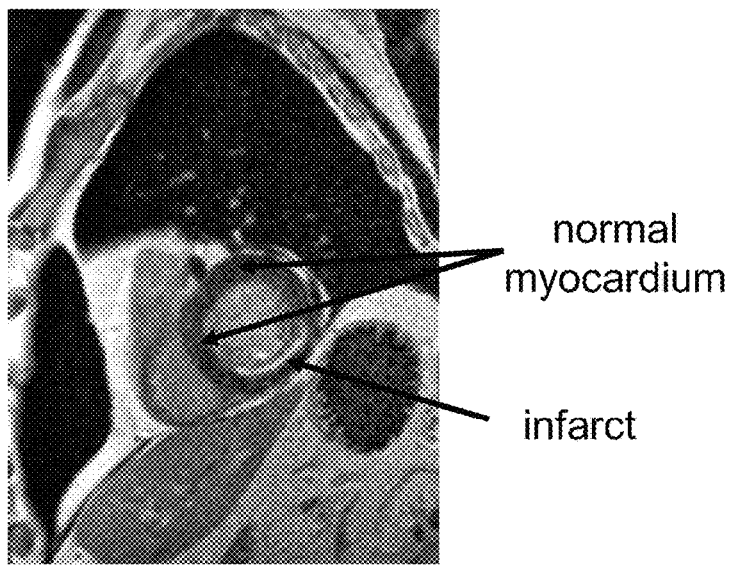
FIG. 3 is an exemplary conventional cardiac inversion recovery (IR) magnetic resonance image.
Figure 4:
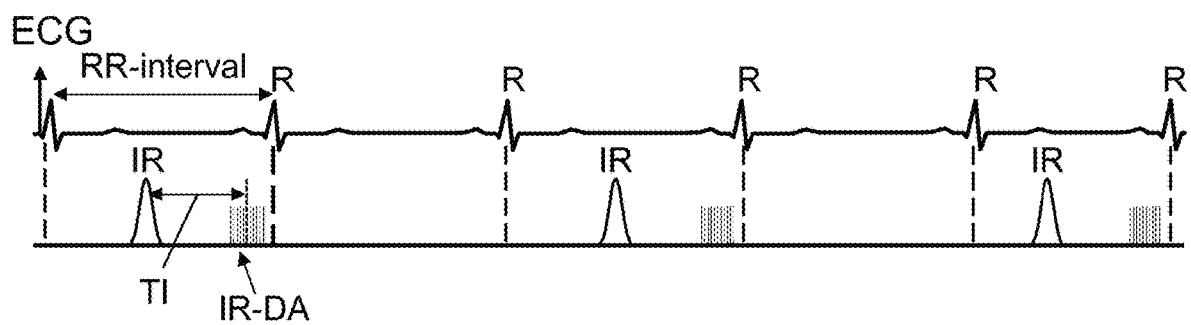
FIG. 4 is a schematic illustration of a pulse sequence for a triggered conventional inversion recovery (IR) magnetic resonance imaging procedure.

Throughout the drawings, the same reference numerals and characters, unless otherwise stated, are used to denote like features, elements, components, or portions of the illustrated embodiments. Similar features may thus be described by the same reference numerals, which indicate to the skilled reader that exchanges of features between different embodiments can be done unless otherwise explicitly stated. Moreover, while the present disclosure will now be described in detail with reference to the figures, it is done so in connection with the illustrative embodiments and is not limited by the particular embodiments illustrated in the figures. It is intended that changes and modifications can be made to the described embodiments without departing from the true scope and spirit of the present disclosure as defined by the appended claims.

DETAILED DESCRIPTION OF EXEMPLARY EMBODIMENTS

The present disclosure relates to methods and systems for providing improved magnetic resonance imaging of tissue affected by cardiovascular pulsatile motion, by reducing dataset misregistration effects and other image artifacts that can arise from various types of motion that may occur when generating inversion recovery and phase reference datasets. Such reduction of undesirable motion artifacts can be obtained by reducing the time interval between obtaining the inversion recovery (IR-DA) and reference (REF) image datasets.

FIG. 1 schematically shows the design of a magnetic resonance system 1 with certain components in accordance with embodiments of the present disclosure. The MR system 1 is configured, inter alia, to provide various magnetic fields tuned to one another as precisely as possible in terms of their temporal and spatial characteristics to facilitate examination of portions of a subject's body using magnetic resonance imaging techniques.

A strong magnet 5 (typically a cryomagnet) having a tunnel-shaped opening is provided in a radio-frequency (RF) shielded measurement chamber 3 to generate a static, strong base (or polarizing) magnetic field 7. The strength of the base magnetic field 7 is typically between 1 Tesla and 3 Tesla, although lower or higher field strengths can be provided in certain embodiments. A body or a body part to be examined (not shown) can be positioned within the substantially homogeneous region of the base magnetic field 7, e.g., provided on a patient bed 9.

Excitation of nuclear spins of certain atoms within the body can be provided via magnetic RF excitation pulses that are radiated using an RF antenna 13, such as a body coil. Other configurations of RF coils or antennas can also be provided in further embodiments, and such configurations may be adapted for particular portions of the subject anatomy to be imaged. The RF excitation pulses are generated by a pulse generation unit 15 that is controlled by a pulse sequence control unit 17. After an amplification by a radio-frequency amplifier 19, the RF pulses are relayed to the RF antenna 13. The exemplary RF system shown in FIG. 1 is a schematic illustration, and particular configurations of the various components may vary from that illustrated in exemplary embodiments of the disclosure. For example, the MR system 1 can include a plurality of pulse generation units 15, a plurality of RF amplifiers 19, and/or a plurality of RF antennas 13 that may have different configurations depending on the body parts being imaged.

The magnetic resonance system 1 further includes gradient coils 21 that can provide directionally and temporally varied magnetic gradient fields for selective excitation and spatial encoding of the RF signals that are emitted and/or received by the RF antenna(s) 13. The gradient coils 21 are typically oriented along the three primary axes (x- y- and z-directions), although other or additional orientations may be used in certain embodiments. Pulsed current supplied to the gradient coils 21 can be controlled by a gradient coil control unit 23 that, like the pulse generation unit 15, is connected with the pulse sequence control unit 27. By controlling the pulsed current supplied to the gradient coils 21, transient gradient magnetic fields in the x-, y-, and z-directions can be superimposed on the static base magnetic field B0. This makes it possible to set and vary, for example, the directions and magnitudes of a slice gradient magnetic field Gs, a phase encode gradient magnetic field Ge, and a read (frequency encode) gradient magnetic field Gr, which can be synchronized with emission and detection of RF pulses. Such interactions between RF pulses and transient magnetic fields can provide spatially selective excitation and spatial encoding of RF signals.

RF signals emitted by the excited nuclear spins can be detected by the RF antenna 13 and/or by local coils 25, amplified by associated radio-frequency preamplifiers 27, and processed further and digitized by an acquisition unit 29. In certain embodiments where a coil 13 (such as, for example, a body coil) can be operated both in transmission mode and in acquisition mode (e.g., it can be used to both emit RF excitation pulses and receive RF signals emitted by nuclear spins), the correct relaying of RF energy is regulated by an upstream transmission-reception diplexer 39.

An image processing unit 31 can generate one or more images based on the RF signals that represent image data. Such images can be presented to a user via an operator console 33 and/or be stored in a memory unit 35. A processor arrangement 37 can be provided in communication with the memory unit 35, and configured to execute computer-executable instructions stored in the memory unit 35 to control various individual system components. For example, the processor arrangement 37 can be configured by programmed instructions to control components such as, e.g., the gradient coil control unit 23, the pulse generation unit 15, and/or the pulse sequence control unit 27 to generate particular sequences of RF pulses and magnetic field variations, process and/or manipulate image data, etc., according to exemplary embodiments of the disclosure described herein.

Embodiments of the present disclosure can provide an MR imaging system 1 as that shown in FIG. 1 that is configured to provide PSIR imaging sequences that are capable of obtaining IR and reference datasets within the duration of a single heartbeat, as described herein. The MR system 1 can be further configured to process such PSIR image data to generate images of the volume of interest, which may be an anatomical volume such as a cardiac structure. Further embodiments can provide a magnetic resonance imaging system that is specifically configured to perform any of the imaging methods and procedures disclosed herein, and combinations of such methods and procedures.

Embodiments of this disclosure can reduce or minimize misregistration between an inversion recovery dataset and the corresponding reference dataset by advantageously collecting IR and reference image data closer in time, e.g., in less than the duration of one RR-interval (also referred to as a cardiac cycle).

Consistency in the instantaneous shape of the heart, rather than maintaining a particular location within a cardiac cycle (the phase), is the most important factor in preventing spatial misregistration in PSIR image data acquisitions. This distinction is not conventionally recognized, as it is typically assumed that the heart has a different shape during different cardiac phases. This results in the common assumption that paired IR and reference datasets must be acquired in the same cardiac phase.

Figure 7:
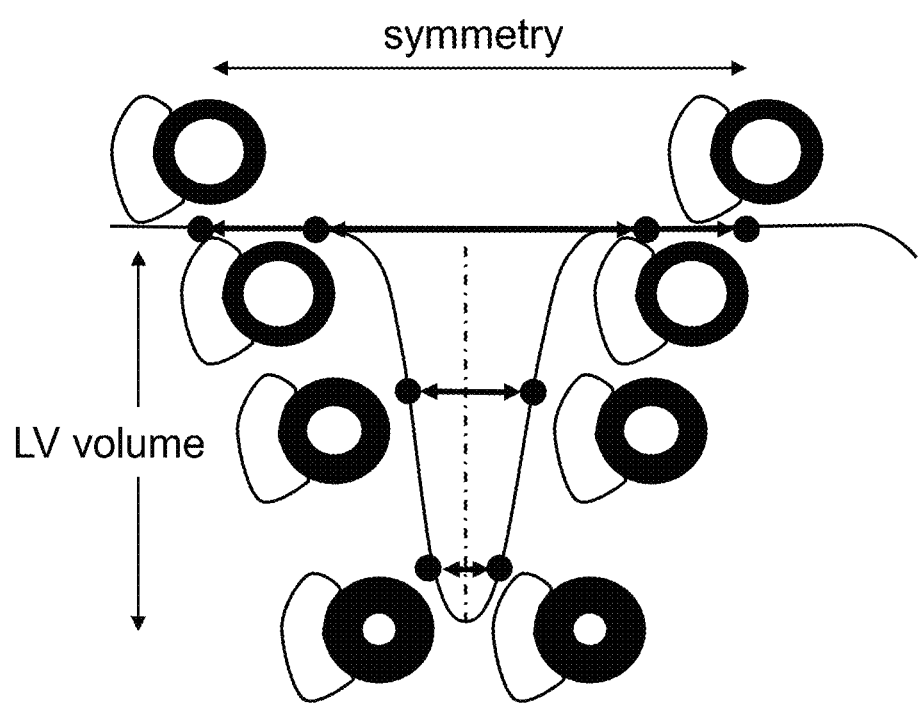
FIG. 7 is a schematic illustration of the symmetrical variation of the left and right ventricle shape during a cardiac cycle.

The various embodiments of the present disclosure described herein remove this same-phase imaging restriction. Because the cardiac cycle (and the contraction pattern of the heart) is cyclical, it has been recognized that there are at least two time points within each cardiac cycle when the heart has the same shape. For example, FIG. 7 is a schematic illustration of the left ventricle (LV) cross-sectional volume and shape during a single cardiac cycle (heartbeat). In this figure, time progresses from left to right, and the vertical axis represents the volume of the LV. Similar cyclical shape and size changes occur for other portions of the heart (e.g., the right ventricle, etc.) and for other vascular structures throughout the body (although generally to a lesser degree) during the cardiac cycle.

The cardiac cycle in FIG. 7 begins with the left ventricle relaxed (the diastolic phase, or diastole), having a relatively large volume. The LV then begins to contract, and continues to do so through the first half of the cycle. Once the LV reaches its minimal volume (systole), about halfway through the cycle, it begins to expand again until it reaches the relaxed diastole state. This sequence of contraction followed by expansion/relaxation of the LV is substantially symmetric around the midpoint of the cycle (denoted by the vertical dashed line in FIG. 7), such that there are at least two times during each cycle where the LV has substantially the same shape. In other words, the shape of the heart during the initial contraction sequence is substantially mirrored during the subsequent expansion in the latter portion of the cardiac cycle.

Further, the heart will have nearly the same shape and volume throughout the period of diastole (when the heart is relaxed), indicated by the two pairs of dots on the upper horizontal line (maximum LV volume) in FIG. 7. This diastole period is relatively long compared with systole, where the LV volume continuously shrinks to a minimum value and then immediately begins increasing. These observations suggest that a variety of different cardiac phases may be used to acquire the paired datasets for PSIR MR imaging. By utilizing two different phases within a cardiac cycle to obtain the two paired image datasets (IR-DA and REF), the temporal interval between obtaining of these datasets can be reduced to also reduce or minimize motion-related misregistration of the datasets, which may arise from respiration, ectopic heartbeats, subject movement, etc.

Figure 5:
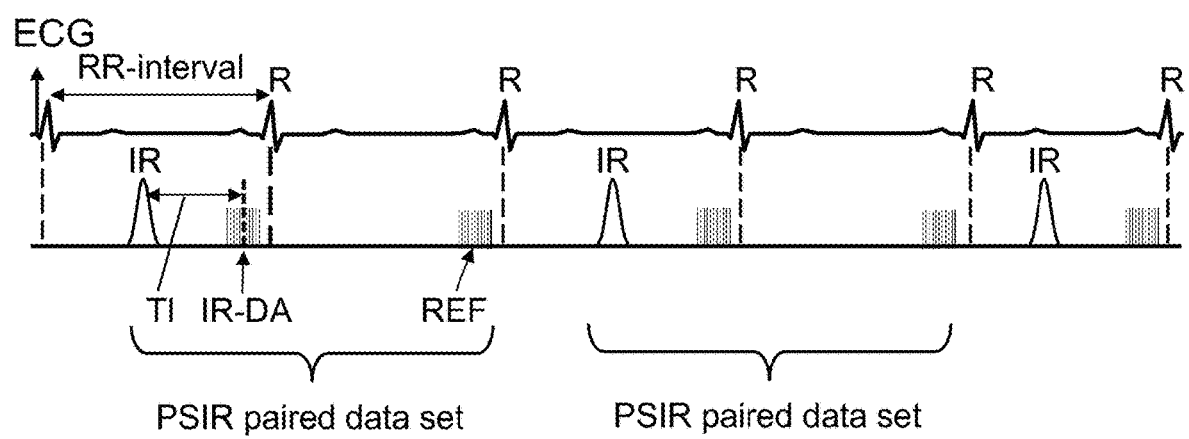
FIG. 5 is a schematic illustration of a pulse sequence for a triggered conventional phase-sensitive inversion recovery (PSIR) magnetic resonance imaging procedure.
Figure 6:
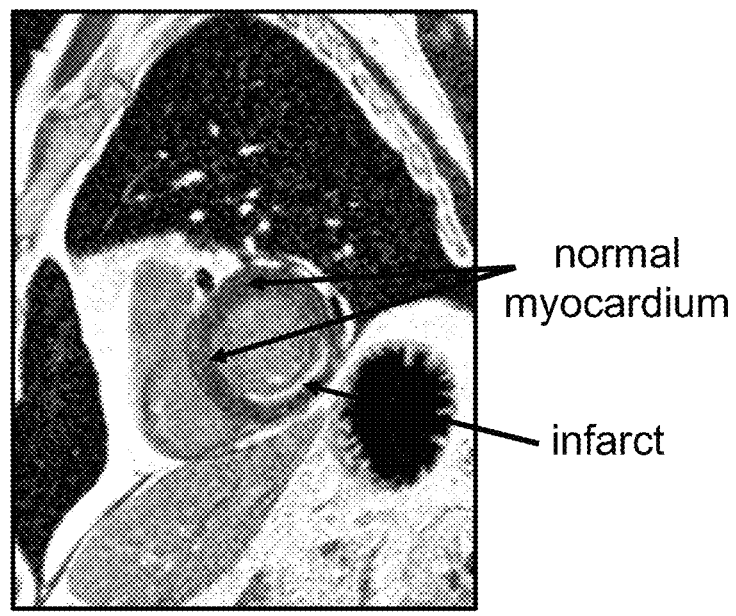
FIG. 6 is an exemplary conventional cardiac phase-sensitive inversion recovery (PSIR) magnetic resonance image.
Figure 8:
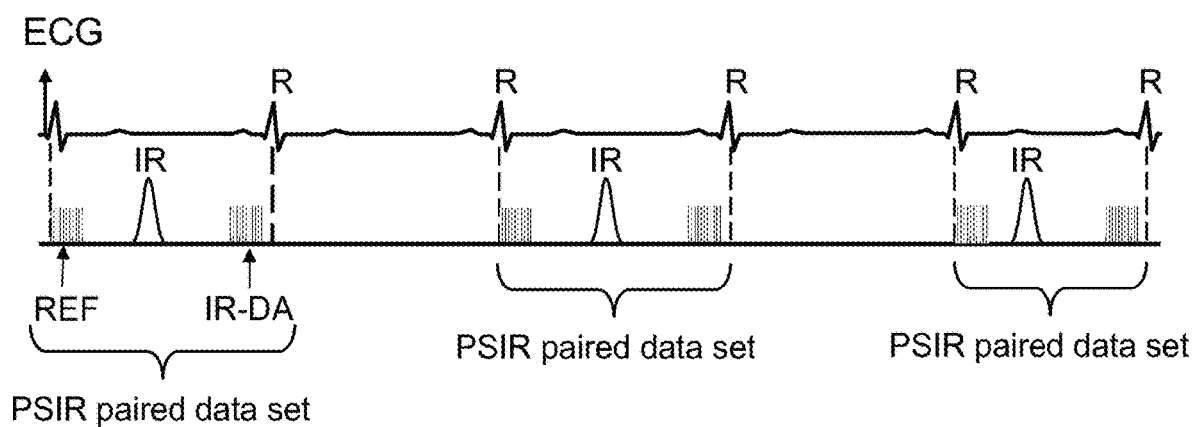
FIG. 8 is a schematic illustration of a pulse sequence for a triggered phase-sensitive inversion recovery (PSIR) magnetic resonance imaging procedure in accordance with embodiments of the present disclosure.

In one exemplary embodiment of the disclosure, the reference image dataset can be obtained early in the cardiac cycle—for example, shortly after the R-wave (e.g. in late diastole, prior to systole) and the corresponding inversion recovery dataset (IR-DA) can be obtained later in the same cardiac cycle, during early-to-mid diastole and prior to the next R-wave. This data acquisition sequence is illustrated in FIG. 8, where it can be seen that the total acquisition time for the PSIR paired data segments (REF dataset plus IR-DA dataset) is less than the duration of a single RR-interval. This can be compared to the time interval required to obtain the paired data segment in a conventional PSIR imaging procedure, which is greater than the duration of a single RR-interval as illustrated in FIG. 5.

Figure 9:
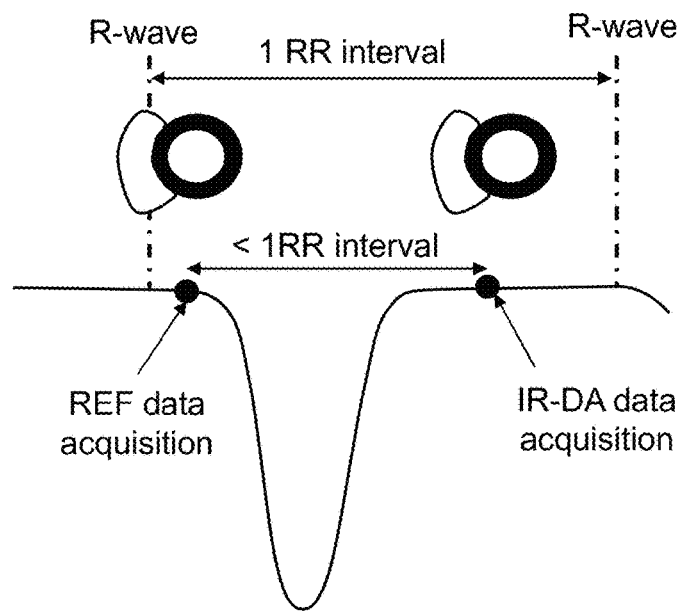
FIG. 9 is a schematic illustration of the timing of image dataset acquisitions for the cardiac PSIR imaging sequence shown in FIG. 8.

A single paired PSIR data acquisition sequence in accordance with certain embodiments of the disclosure and shown in FIG. 8, is illustrated together with the corresponding cardiac cycle for the left ventricle in FIG. 9. As can be seen in FIG. 9, the REF dataset is acquired shortly after an R-wave, when the LV is in diastole. The IR-DA dataset is acquired after systole is reached, later in the same cardiac cycle, when the LV has returned to the diastole shape. Accordingly, the two paired PSIR datasets can be obtained within a single RR-interval, which is a shorter interval than that used in conventional PSIR techniques.

Because the heart will have a similar shape (e.g. the relaxed diastole shape) for both acquisitions shown in FIG. 8 (see FIG. 9), there should not be any significant spatial misregistration errors due to cardiac phase differences between the acquisitions. Further, because the time interval between the REF and IR-DA image data acquisitions is much shorter than in conventional PSIR sequences, motion effects arising from breathing, movement of the subject, etc., should be greatly reduced to further improve registration of the two datasets. Additionally, by skipping a cardiac cycle between acquisitions of PSIR paired data segments, as shown in FIG. 8, the subsequent REF data acquisition will occur a relatively long time after the preceding IR pulse, such that the inverted magnetization will be substantially recovered during each REF data acquisition sequence.

It should also be noted that the timing of the REF data acquisition sequence shown in FIG. 8, which occurs shortly after the R-wave, is contrary to conventional cardiac imaging procedures because it is generally assumed that cardiac contraction starts too soon after the R-wave for this cardiac phase to be used for imaging without introducing cardiac motion. This is because the R-wave is the electrical signal of the heart that triggers the systole cycle. However, mechanical systole lags electrical systole, and there may be a brief period of time in mechanical end-diastole (e.g. immediately after the R-wave) for which the heart is in the same shape as in early to mid-diastole. In other words, although the electrical R-wave pulse "activates" contraction of the ventricle, such (mechanical) contraction does not begin immediately. As noted earlier, the mechanical diastole period following the R-wave can be about 100-150 ms in duration, where the heart remains in diastole with very little motion. This insight allows pairing of a reference dataset acquisition immediately after the R-wave with a conventional dataset acquisition in early to mid-diastole, as illustrated in FIGS. 8 and 9. Certain embodiments of the present disclosure take advantage of this late diastole period to generate useful image datasets.

Figure 10:
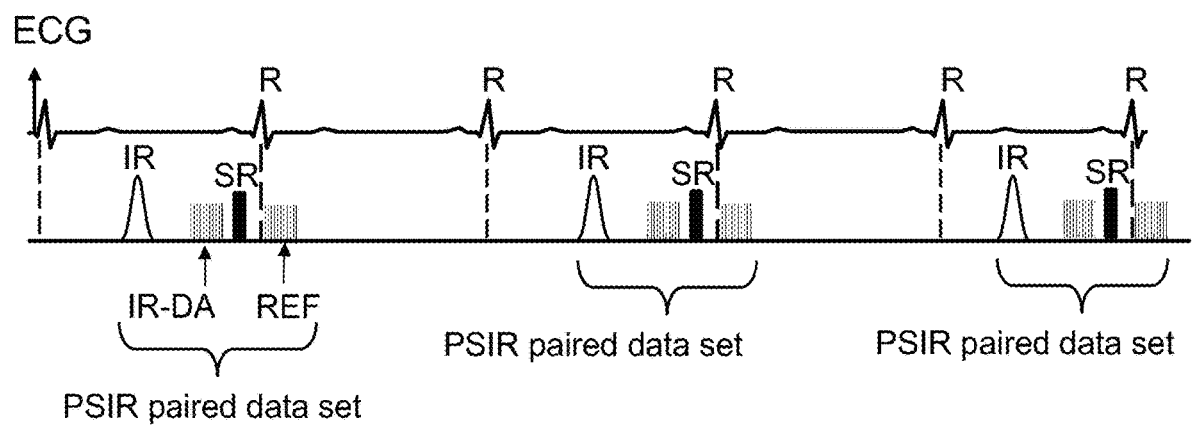
FIG. 10 is a schematic illustration of another pulse sequence for a triggered phase-sensitive inversion recovery (PSIR) magnetic resonance imaging procedure in accordance with further embodiments of the present disclosure.

In a further embodiment of the disclosure, illustrated in FIG. 10, a PSIR sequence can be provided in which the inversion recovery dataset (IR-DA) can be obtained late in a cardiac cycle (during early diastole), and the corresponding reference image dataset (REF) can be obtained early in the subsequent cardiac cycle, e.g., shortly after the R-wave. The total duration of this paired data acquisition (IR pulse followed by acquisition of the IR-DA and REF datasets) is again less than the duration of a single RR-interval. In contrast to the exemplary sequence shown in FIG. 8, the paired datasets in the PSIR sequence illustrated in FIG. 10 are obtained in consecutive cardiac cycles, i.e., not between the same pair of consecutive R-waves. Nevertheless, the time interval required to obtain each paired dataset (which may be a segmented or single-shot dataset) is still less than the duration of a single RR-interval, as illustrated in FIG. 10.

Figure 11:
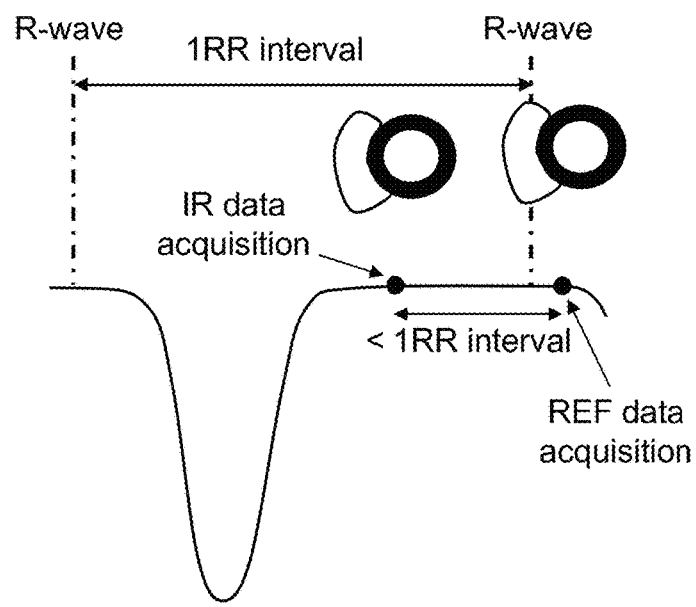
FIG. 11 is a schematic illustration of the timing of image dataset acquisitions for the further cardiac PSIR imaging sequence shown in FIG. 10.

The paired PSIR data acquisition sequence in accordance with certain embodiments of the disclosure shown in FIG. 10 is illustrated schematically with the corresponding cardiac cycle in FIG. 11. As can be seen in FIG. 11, the IR-DA dataset is obtained in early-to-mid diastole, before an R-wave, and the corresponding REF dataset is acquired shortly after the same R-wave, in late diastole of the same mechanical cardiac cycle. Again, as with the embodiment illustrated in FIGS. 8 and 9, the two paired PSIR datasets can be obtained over a time interval that is shorter than the duration of a single RR-interval. This shortened interval between acquisition of paired inversion recovery and reference datasets will also reduce the effect of any motion of the subject due to breathing, etc. when registering the two paired datasets to generate a PSIR image.

It is commonly assumed that the reference dataset must be acquired at a sufficient time interval after the inversion pulse so that the magnetization of the tissues of interest will be near +M0 (the equilibrium magnetization), e.g., the inverted magnetization will be substantially completely recovered. This represents another factor why a conventional PSIR implementation requires more than 1 RR-interval in time to acquire the IR-DA and REF datasets. However, it is noted here that the magnetization of the tissues of interest do not need to be near or at +M0 when obtaining a useful reference dataset. Because PSIR techniques construct a sign-corrected image that accounts for the polarity of the magnetization, it is primarily the polarity of magnetization that is important for the reference acquisition, and not the actual magnetization level itself.

In the embodiment of the present disclosure illustrated in FIG. 10, the REF dataset is obtained less than one R-R interval following the IR pulse. To ensure that the polarity of the magnetization is correct (e.g., positive) when obtaining the REF dataset, acquisition of the IR-DA dataset can be followed by a saturation pulse and a conventional gradient crusher sequence (labeled "SR" in FIG. 10) prior to obtaining the REF dataset. This SR sequence can reset the magnetization of all tissues to zero such that the REF dataset acquisition can follow in a short period of time (e.g., <<1 RR-interval), because the polarity of magnetization will be correct during the REF acquisition (i.e. it will all be positive as the magnetizations zeroed by the SR sequence have begun relaxing towards +M0). The tissue magnetizations do not need to be near +M0 when acquiring the REF dataset, but only need be positive in order to provide a phase reference for the IR-DA dataset. Thus, by using the SR (saturation/crusher) sequence prior to acquiring the REF dataset, the time interval between the IR pulse and acquisition of the REF dataset can be less than 1 RR-interval while still providing useful phase sensitivity for reconstructing a PSIR image.

For conventional PSIR techniques, successive R-waves need to appear at regular intervals that are substantially constant. However, in the embodiment illustrated in FIGS. 8 and 9, paired PSIR datasets can be acquired within a single R-R (heartbeat) interval. Further, every second cardiac cycle does not include any data acquisition (readout) events, as illustrated in FIG. 8. Thus, if there were any ectopic (irregular) RR-intervals within this time frame, they would not affect the registration of paired datasets obtained within a single heartbeat interval. Similarly, for the embodiment illustrated in FIGS. 10 and 11, the paired datasets are obtained around a single R-wave, with the following R-wave having no proximal data acquisition sequences. Accordingly, embodiments of the present disclosure can provide PSIR imaging systems and methods that are less likely to be affected by motion artifacts arising from ectopic heartbeats, because only half of the heartbeats need to come in a regular fashion. In contrast, conventional PSIR techniques need all of the heartbeats to be regularly spaced to avoid artifacts arising from non-uniform spacing of R-waves.

It is commonly assumed by those skilled in the art that paired REF and IR-DA datasets for PSIR imaging must be acquired in an identical manner. Specifically, it is generally accepted that the same settings (including the spatial and temporal resolution) must be prescribed for both the REF and IR-DA datasets in order to obtain clinically adequate image quality. It is now proposed that this condition is not required. For example, the reference and inversion recovery datasets can have different spatial resolution, in the frequency- and/or phase-encoding directions, without compromising the spatial resolution of the reconstructed PSIR image.

Specifically, only the inversion recovery (IR-DA) dataset needs to have a high spatial resolution for reconstruction of a high-resolution PSIR image. The reference dataset can have a lower resolution because it is primarily used for sign rectification of the magnetizations by phase correction, and the background phase is well-described by a smooth function with no points (pixels or voxels) of discontinuity. Because the spatial resolution of the reference image dataset can be reduced and still provide rectification of the magnetization polarities for the corresponding inversion recovery dataset, the time to acquire the reference dataset can also be reduced.

As an example, if the reference dataset requires only half the number of phase encoding lines as compared to the IR-DA image dataset, its acquisition takes only half as long as that the IR-DA acquisition. Consequently, the reference acquisition sequence can be inserted into a portion of the cardiac cycle for which the heart is motionless for a limited period, such as the approximately 100-150 ms interval immediately following an R-wave. The mid-diastole portion of a cardiac cycle, where the heart maintains a substantially constant shape for a longer duration, can better accommodate the acquisition sequence for the IR-DA dataset, which is typically longer due to the higher resolution of this dataset as compared to the corresponding REF dataset. This consideration provides further degrees of freedom in constructing a PSIR sequence in accordance with embodiments of the present disclosure that can overcome multiple limitations but still yield a high-quality phase-sensitive image with high-spatial resolution. Embodiments of the disclosure that include lower-resolution REF datasets can include both segmented and single-shot acquisition techniques, as described further below. Using a lower spatial resolution for the REF dataset can be particularly advantageous for single-shot acquisition procedures, because single-shot acquisitions generally require more time than segmented acquisitions.

Embodiments of the present disclosure that include a lower-resolution REF dataset, such as half the resolution of the IR-DA dataset, would appear substantially similar to the sequences illustrated in FIGS. 8 and 10, except that the duration (width) of each REF acquisition sequence would be about half the duration/width of the corresponding IR-DA acquisition sequence. In further embodiments, the resolution of the reference datasets can be a different fraction of the resolution of the corresponding inversion recovery dataset. For example, the resolution of a REF image dataset may be as low as about 20% of that of the corresponding IR-DA dataset without significantly impairing the quality of the reconstructed image.

Based on the considerations of a lower spatial resolution dataset, the REF dataset acquisition sequence can be sufficiently short in time (e.g., about 80-100 ms) to fit between the time of an R-wave and the subsequent onset of cardiac contraction. Also, acquisition of a lower spatial resolution REF dataset does not preclude obtaining a reconstructed PSIR image that has a high spatial resolution. For example, a 256×256 voxel resolution PSIR image could be obtained from a 256×256 voxel resolution inversion recovery (IR-DA) dataset combined with, e.g., a lower-resolution 128× 256 voxel reference dataset.

Embodiments of the disclosure can be used for improved PSIR imaging using segmented acquisition techniques. For example, each PSIR paired dataset in the PSIR sequence illustrated in FIG. 8 can correspond to acquisition of one segment (e.g., one portion of k-space) of the overall image dataset. Each paired dataset in this embodiment acquires the inversion recovery dataset and corresponding reference phase dataset in the same RR-interval. This embodiment has an additional advantage that a single ECG event (a single R-wave) can trigger the acquisition of both the IR-DA and corresponding REF datasets.

Similarly, each paired dataset in the PSIR sequence illustrated in FIG. 10 can also correspond to acquisition of one segment of the overall image dataset. This embodiment can provide a temporal duration for acquiring each pair of datasets that is shorter than the duration needed to acquire a paired dataset in the embodiment shown in FIG. 8, and thus may further reduce the probability of motion-related artifacts in the reconstructed image. Note that two separate R-waves are needed to trigger each PSIR pair of datasets in this embodiment, because the IR-DA and REF datasets are acquired during different (consecutive) RR-intervals.

In both of these embodiments, the total time needed to acquire the paired inversion recovery and reference datasets is less than the duration of one cardiac cycle (one RR-interval), which is an improvement over conventional PSIR imaging techniques.

Further embodiments of the present disclosure can be used for improved imaging using single-shot PSIR data acquisition techniques. For example, each PSIR paired dataset in the PSIR sequences illustrated in FIGS. 8 and 10 can correspond to acquisition of the entire k-space for the image dataset, e.g., corresponding to an image of a single slice of the volume being imaged. Other advantages of these single-shot embodiments are substantially the same as those described above for the corresponding segmented acquisition embodiments.

FIGS. 12-15 show various exemplary results obtained using embodiments of the present disclosure, in which the resolution of the reference image dataset is varied to demonstrate the effect of lower-resolution reference datasets on reconstructed PSIR images. In each of these figures, images were obtained of a slice through three bottles: a large water bottle with short T1 (water doped with Gadolinium-DTPA, a T1-shortening contrast agent, left); a small water bottle (water without contrast agent, long T1, center); and an oil bottle (short T1, right). The images in these figures were obtained based on a conventional PSIR sequence such as that shown in FIG. 8, but without any ECG gating/triggering because the objects being imaged are static.

Figure 12A:
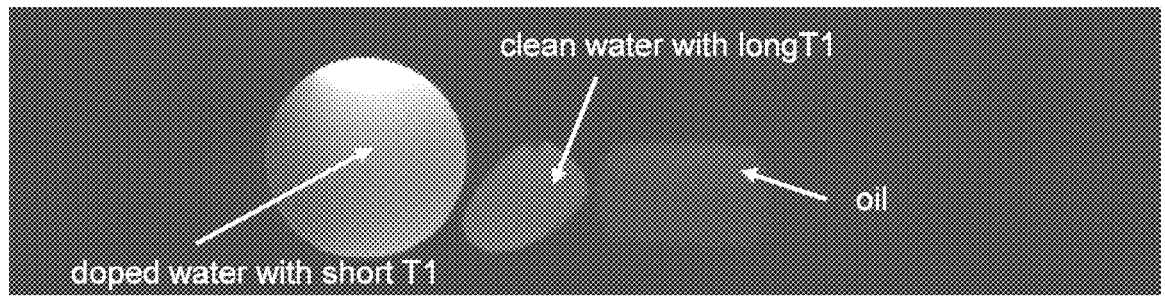
FIG. 12A is a slice image of three test objects reconstructed from conventional inversion recovery (IR) image data.
Figure 12B:
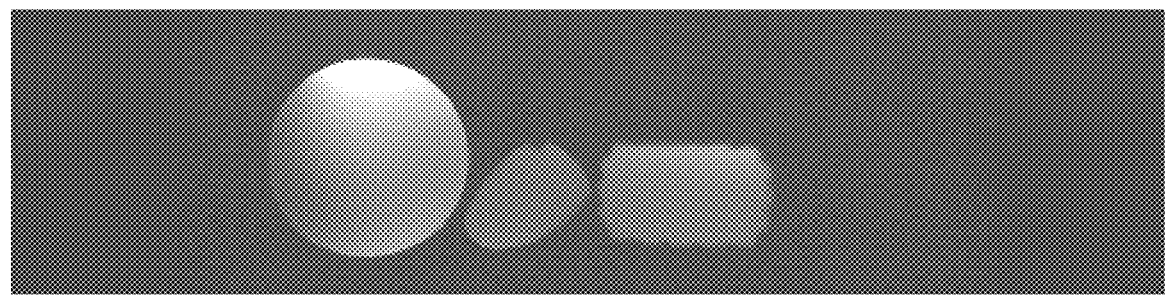
FIG. 12B is a slice image of the same three test objects of FIG. 12A, reconstructed from reference image data having the same resolution as the IR image data used to reconstruct the image in FIG. 12A.
Figure 12C:
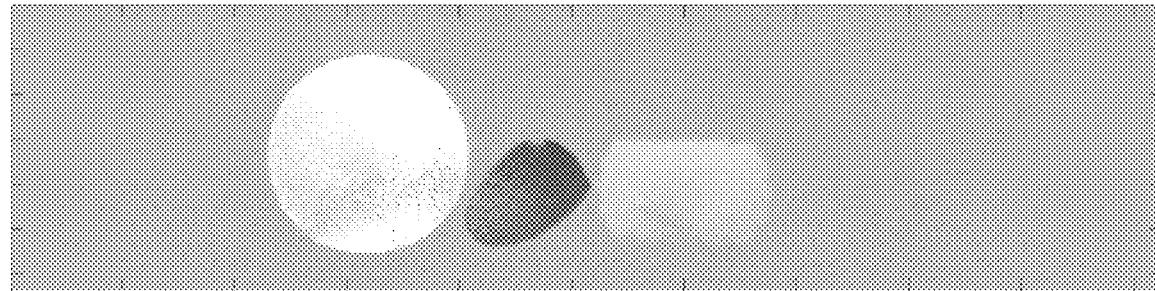
FIG. 12C is a phase-sensitive inversion recovery (PSIR) image reconstructed using the image datasets from FIGS. 12A and 12B.

FIG. 12A is a conventional inversion recovery (magnitude) image of the 3-bottle cross-sectional slice that can be obtained with a standard high-resolution inversion recovery sequence. The image in FIG. 12B represents a magnitude reconstruction of the corresponding high-resolution reference phase dataset. This image is shown only to illustrate its high spatial resolution, and would not be displayed in clinical practice. The image shown in FIG. 12C is a reconstructed PSIR image that is derived from both the high-resolution inversion recovery and reference datasets that generated the images in FIGS. 12A and 12B, respectively.

Figure 13A:
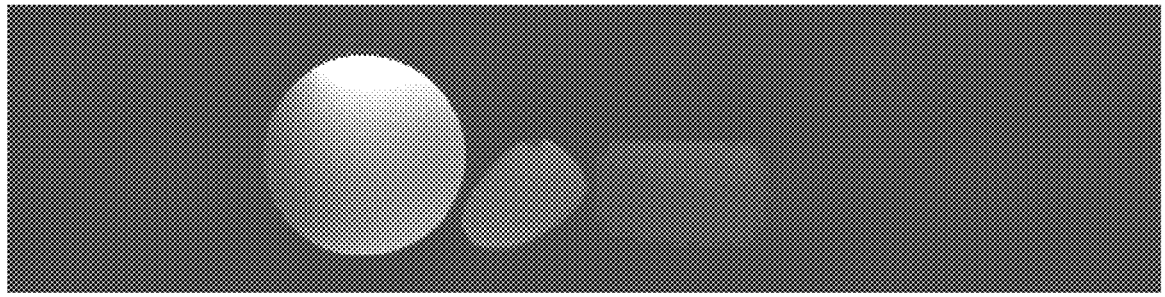
FIG. 13A is the same slice image of three test objects shown in FIG. 12A.

FIG. 13A is the same high-resolution inversion recovery (magnitude) image shown in FIG. 12A. However, the image shown in FIG. 13B is obtained from a reference image dataset having half the spatial resolution (in the phase-encoding direction) of the IR dataset used to generate the image in FIG. 13A.

Figure 14A:
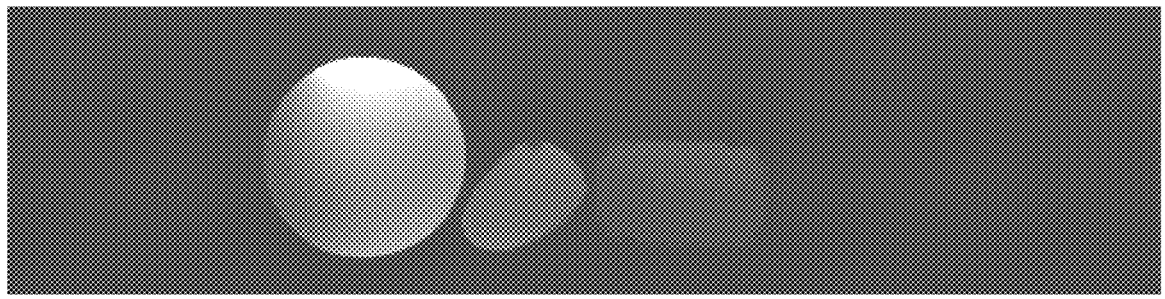
FIG. 14A is the same slice image of three test objects shown in FIG. 12A.

FIG. 14A is the same high-resolution inversion recovery (magnitude) image shown in FIGS. 12A and 13A. In this figure, the reference dataset used to generate the image in FIG. 14B, and (with the IR data of FIG. 14A) to reconstruct the PSIR image in FIG. 14C, has half the spatial resolution (in the frequency-encoding direction) of the IR dataset used to generate the image in FIG. 13A.

Figure 15A:
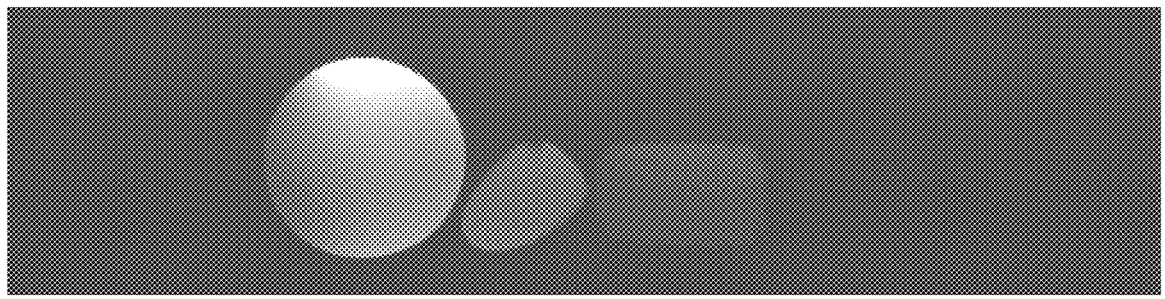
FIG. 15A is the same slice image of three test objects shown in FIG. 12A.

FIG. 15A is the same high-resolution IR image of the three bottles as FIGS. 12A, 13A, and 14A. In this figure, the reference dataset used to generate the image in FIG. 15B and to reconstruct the PSIR image shown in FIG. 15C has half the spatial resolution of the IR dataset in both the frequency-encoding and phase-encoding directions. Thus, the reference dataset used to reconstruct the image in FIG. 15C has only one-quarter the overall spatial resolution of the IR dataset used to generate the image in FIG. 15A.

Figure 13B:
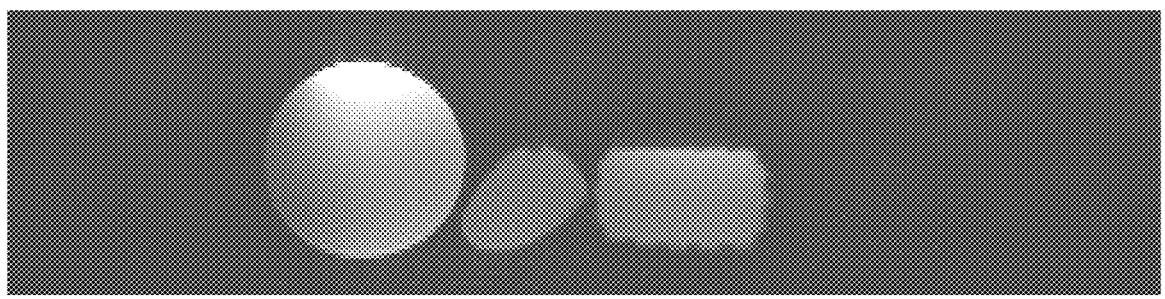
FIG. 13B is a slice image of the same three test objects of FIG. 13A, reconstructed from reference image data having half the spatial resolution in the phase-encoding direction as the image data used to reconstruct the image in FIG. 13A.
Figure 13C:
FIG. 13C is a phase-sensitive inversion recovery (PSIR) image reconstructed using the image datasets from FIGS. 13A and 13B.
Figure 14B:
FIG. 14B is a slice image of the same three test objects of FIG. 14A, reconstructed from reference image data having half the spatial resolution in the frequency-encoding direction as the image data used to reconstruct the image in FIG. 14A.
Figure 14C:
FIG. 14C is a phase-sensitive inversion recovery (PSIR) image reconstructed using the image datasets from FIGS. 14A and 14B.
Figure 15B:
FIG. 15B is a slice image of the same three test objects of FIG. 15A, reconstructed from reference image data having half the spatial resolution in both the frequency-encoding and phase-encoding directions as the image data used to reconstruct the image in FIG. 15A.
Figure 15C:
FIG. 15C is a phase-sensitive inversion recovery (PSIR) image reconstructed using the image datasets from FIGS. 15A and 15B.

The reduced spatial resolution (in one or both encoding directions) of the images in FIGS. 13B, 14B, and 15B (the images constructed from the reference image data only) can be clearly seen. By comparing the reconstructed PSIR images in FIG. 12C (using a high-resolution reference dataset) to the reconstructed PSIR images in FIGS. 13C, 14C, and 15C (which are based on a lower-resolution reference dataset), it can be observed that using a lower spatial resolution for the reference dataset results in no evident degradation in the spatial resolution of the reconstructed PSIR image. Further, the larger pixel size of the lower resolution reference datasets appears to result in less speckle noise (fewer speckles) in the reconstructed PSIR images, because the signal-to noise ratio increases with pixel size. Therefore, some embodiments of the present disclosure that use a lower-resolution reference dataset may reduce speckle noise artifacts in addition to misregistration artifacts.

Figure 16:
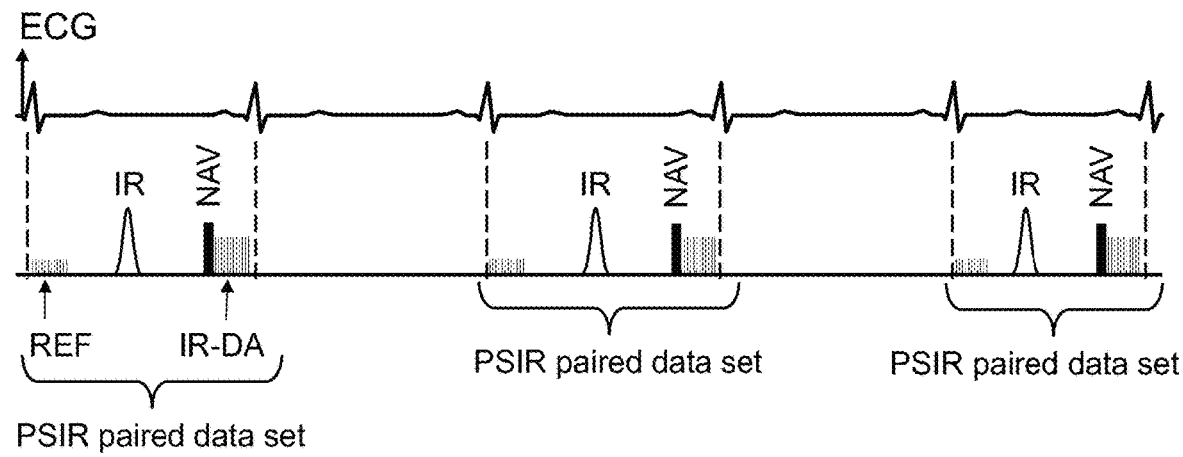
FIG. 16 is a schematic illustration of a pulse sequence for a triggered phase-sensitive inversion recovery (PSIR) magnetic resonance imaging procedure with a navigator in accordance with embodiments of the present disclosure.

Further embodiments of the disclosure can provide improved PSIR imaging systems and techniques for respiratory-navigated ECG-triggered imaging. Such an exemplary navigator-based PSIR imaging sequence is illustrated in FIG. 16. This PSIR sequence is similar to that shown in FIG. 8, with the reference dataset (REF) being acquired shortly after an R-wave (late diastole phase) and the associated inversion recovery dataset (IR-DA) being acquired prior to the next R-wave (e.g., in early-mid diastole). These dataset pairs are each acquired within a single RR-interval.

The navigator events (NAVs) in this embodiment are labeled with 'NAV' in FIG. 16, and in this embodiment they immediately precede each IR-DA acquisition. Each NAV acquires one line in a head-to-feet direction (e.g., perpendicular to the transverse plane) and is configured to track the position of the liver-lung interface. If this interface is outside a predefined acceptance window, the IR-DA and REF datasets corresponding to that NAV event will be discarded and reacquired until the NAV-detected interface is within the acceptance window.

The navigator-based embodiment shown in FIG. 16 includes a navigator that is provided between each pair of REF/IR-DA dataset acquisitions. This results in a NAV event which is close in time to acquisition of both datasets, thereby improving the spatial registration of both datasets. In FIG. 16, the NAV event is shown to occur immediately prior to the acquisition of the IR-DA dataset. In further embodiments, the NAV event can be provided anywhere between the acquisitions of the REF and IR-DA datasets. Such timing of the NAV sequences can provide effective spatial registration of both paired datasets.

Figure 17:
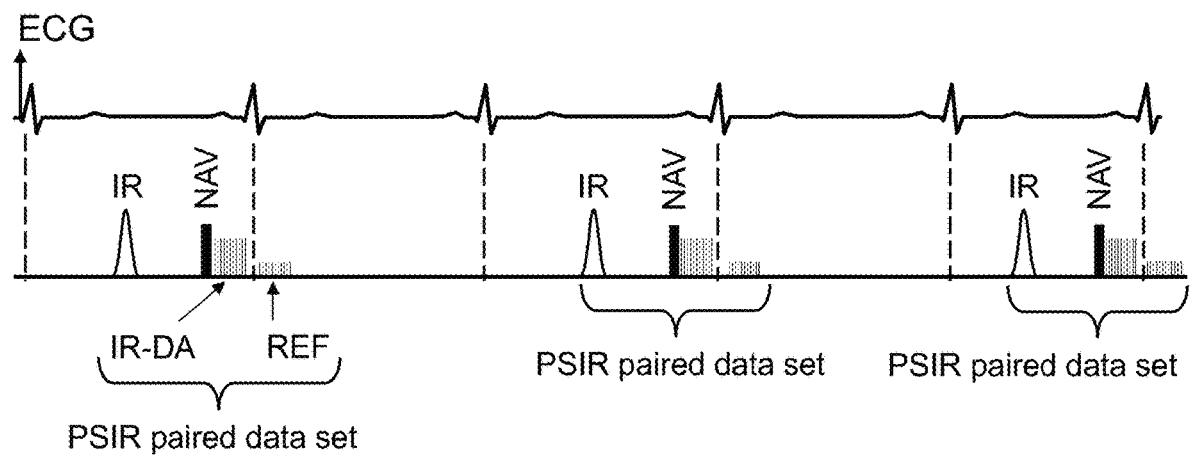
FIG. 17 is a schematic illustration of a further pulse sequence for a triggered phase-sensitive inversion recovery (PSIR) magnetic resonance imaging procedure with a navigator in accordance with further embodiments of the present disclosure.

In a further embodiment, navigator-based PSIR imaging methods and systems can be provided that include a PSIR imaging sequence similar to that shown in FIG. 10, with the inversion recovery dataset (IR-DA) being acquired prior to an R-wave (e.g., in early-mid diastole) and the associated reference dataset (REF) being acquired shortly after the R-wave (e.g., in the late diastole phase). The NAV sequence or event can be provided between these paired dataset acquisitions, e.g., just before the R-wave. Such an exemplary navigator-based PSIR sequence is illustrated in FIG. 17. For visual clarity in seeing the timing of the NAV in FIG. 17, the saturation pulse that follows the IR-DA dataset acquisition is not shown in this figure.

Again, each NAV can be configured to acquire one line in a head-to-feet direction and to track the position of the liver-lung interface. In this embodiment, the total time needed to acquire each paired dataset is shorter than that needed for the embodiment shown in FIG. 16. Accordingly, in further embodiments, the NAV event for the exemplary PSIR imaging sequence shown in FIG. 17 can also be provided, e.g., immediately before the IR-DA dataset acquisition, or immediately following acquisition of the REF dataset. In any of these embodiments, the NAV event is sufficiently close in time to both the reference and inversion recovery dataset acquisitions to provide good spatial registration for both datasets.

Various combinations of the embodiments described herein can also be provided to yield improved PSIR imaging systems and methods. For example, the navigator-based embodiments shown in FIGS. 16 and 17 can also include a REF dataset that has a reduced spatial resolution in one or both encoding directions as compared to the resolution of the IR-DA dataset. Such combinations of features from different embodiments can provide all of the benefits of those embodiments as described herein.

In some embodiments of the disclosure, the data acquisition sequences (readouts) can be gradient recalled echo (GRE) sequences. In further embodiments, the data readout sequences can be steady-state free-precession (SSFP)

sequences. In still further embodiments, the data readouts can be segmented data acquisitions (to generate segmented paired image datasets) or single-shot data acquisitions (to generate single-shot paired image datasets). In additional embodiments of the disclosure, the order of reference phase dataset and conventional dataset acquisitions in each paired dataset can be reversed. These additional features and options can be combined in yet further embodiments, as long as there are no technical or temporal considerations that may preclude such combinations, to provide systems and methods that yield the cumulative benefits of such combined features.

Figure 18A:
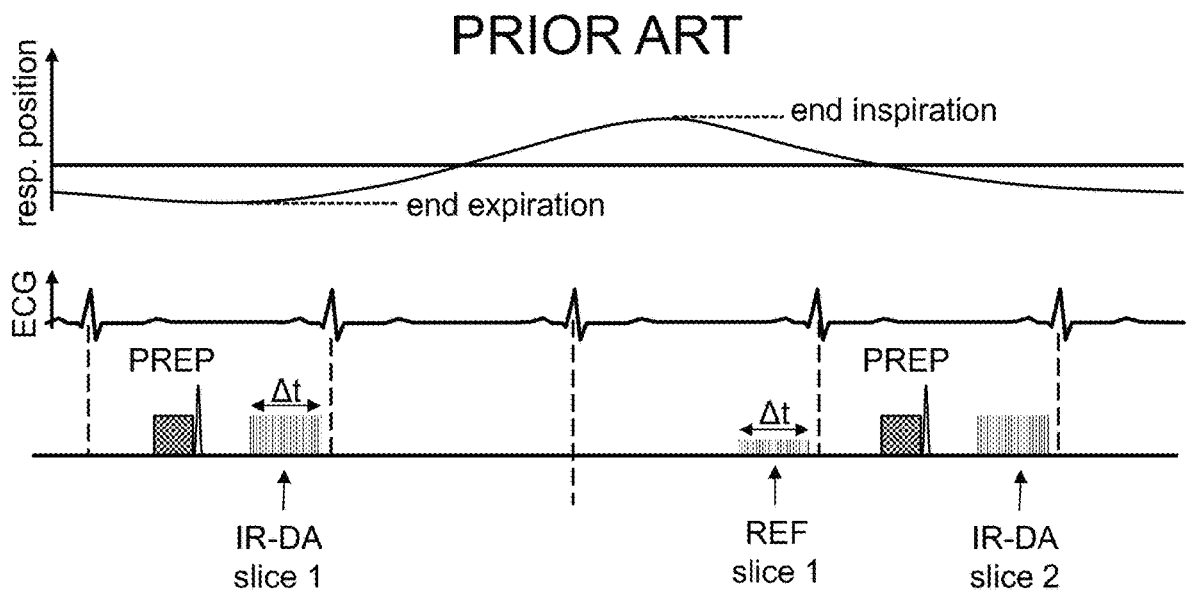
FIG. 18A is a schematic illustration of a conventional FIDDLE magnetic resonance imaging pulse sequence.

In further embodiments, the magnetization preparations can be combined preparations such as, e.g., a combination of magnetization transfer and inversion that may be used in flow-independent dark-blood delayed enhancement (FIDDLE) imaging procedures. For example, features of a conventional single-shot FIDDLE sequence are schematically illustrated in FIG. 18A. The topmost graph in FIG. 18A (labeled "resp. position") shows the timing of an exemplary respiratory cycle relative to the imaging sequence. The middle graph in this figure (labeled "ECG") is an exemplary electrocardiogram trace that shows the R-wave signals used to trigger sequences in this triggered technique.

The lower portion of FIG. 18A shows the magnetization and pulse sequences that are used in a conventional FIDDLE imaging procedure. A preparation sequence (labeled "PREP") includes a prep puke that differentially saturates tissue compared with blood, and is followed by an inversion pulse to generate phase-sensitive inversion recovery image data. The inversion recovery dataset readout (IR-DA) occurs after the PREP sequence but within the same cardiac cycle (e.g., between the same two R-waves, as shown in FIG. 18A). This readout sequence has a duration of $\Delta t$.

A reference data readout sequence (labeled "REF") is typically provided at a significant time interval following the prior PREP sequence, such that the magnetizations have sufficiently recovered when acquiring the reference image dataset. In FIG. 18A, the reference dataset readout occurs in the second cardiac cycle following the prior PREP sequence, and in a cardiac cycle that precedes the subsequent PREP sequence. It is preferable that the REF acquisition is close in time to the IR-DA readout to obtain good registration between the datasets for the PSIR procedure, as described herein above for conventional PSIR techniques. Accordingly, the REF readout generally occurs in the same phase of the cardiac cycle as the IR-DA readout, but in the previous cardiac cycle as shown in the right half of FIG. 18A. The REF image dataset typically has the same spatial resolution as the inversion recovery dataset (IR-DA), and thus also has a duration of $\Delta t$.

Figure 18B:
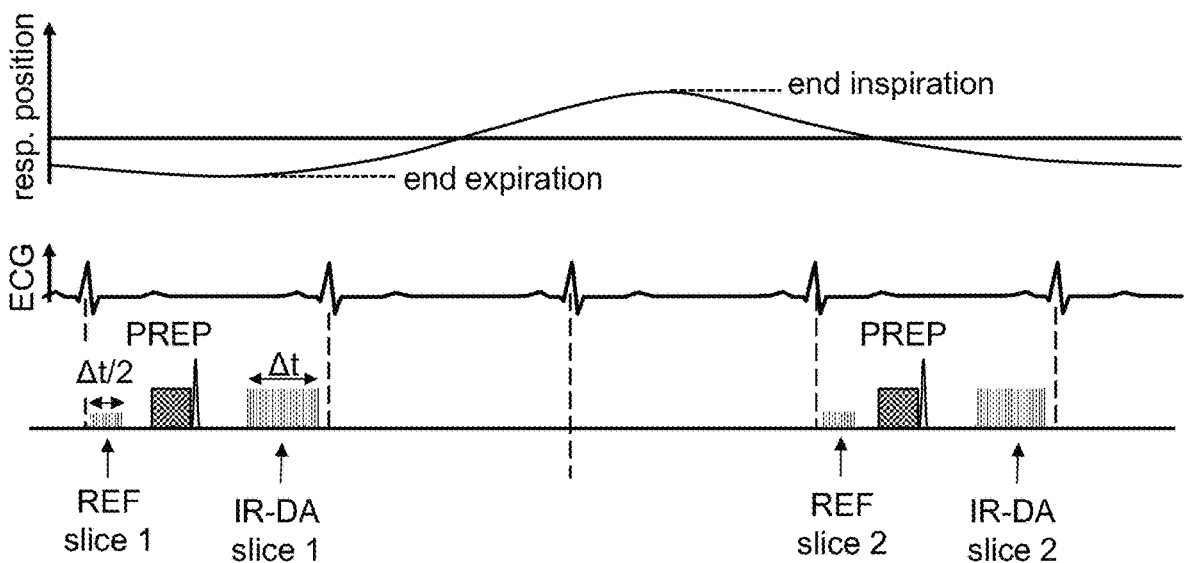
FIG. 18B is a schematic illustration of a modified FIDDLE magnetic resonance imaging pulse sequence in accordance with embodiments of the present disclosure.

FIG. 18B is a schematic illustration of a modified FIDDLE imaging procedure in accordance with embodiments of the present disclosure. In this imaging sequence, the reference dataset (REF) is acquired in the same RR-interval as the IR-DA inversion recovery dataset, just after the R-wave (e.g., in late diastole). As described herein, the heart will have substantially the same shape in the late diastole phase as in the early-to-mid diastole phase, when the IR-DA readout is performed. Thus, the conventional requirement that the two image datasets be acquired during the same phase of different cardiac cycles can be avoided, as described in more detail with respect to other embodiments herein. This allows the REF and IR-DA datasets to be acquired more closely together in time, thereby improving spatial registration of the two datasets.

Further, the REF dataset in FIG. 18B can be acquired at half the spatial resolution of the IR-DA dataset (e.g., half the resolution in the phase-encoding direction), such that it has half the duration ($\Delta t/2$) of the IR-DA readout and the conventional REF readout (i.e., $\Delta t$). As described herein above, such reduced resolution in the reference dataset acquisition does not appear to degrade the resolution of the reconstructed PSIR image, and may even reduce the amount of speckles in such images. Other fractional spatial resolutions can be used when acquiring the REF dataset (as compared to the IR-DA dataset resolution), with a proportional reduction in the associated acquisition time.

Figure 19A:
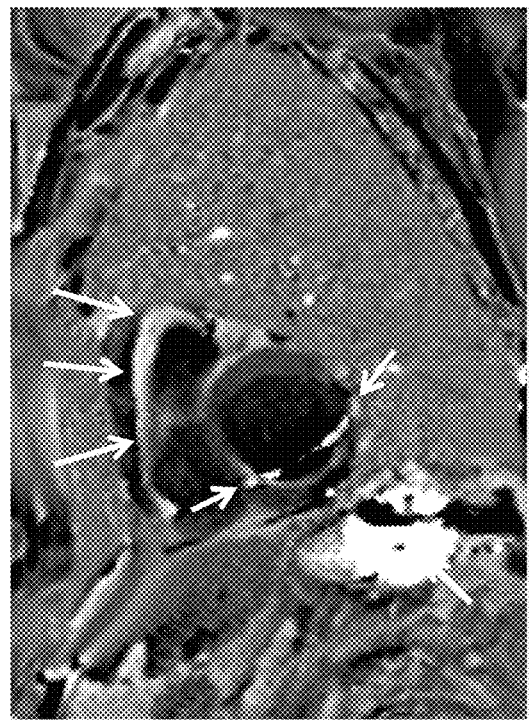
FIG. 19A is an exemplary single-shot image obtained using the conventional FIDDLE magnetic resonance imaging pulse sequence shown in FIG. 18A.
Figure 19B:
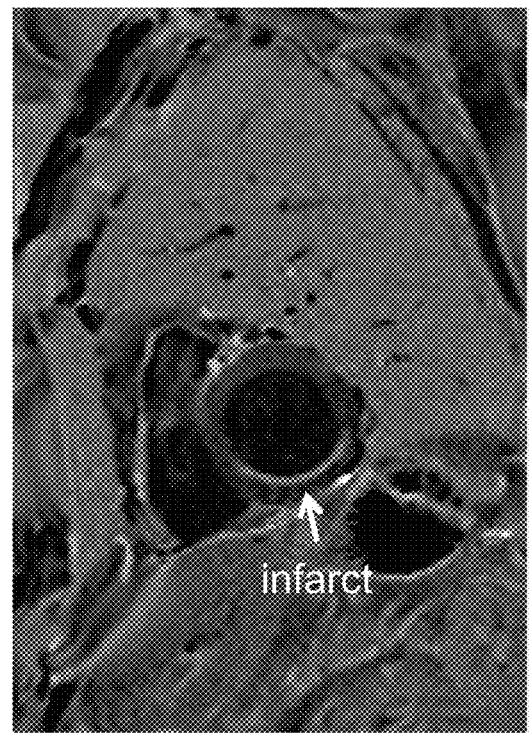
FIG. 19B is an exemplary single-shot image obtained using the FIDDLE magnetic resonance imaging pulse sequence shown in FIG. 18B.

The benefits of this modified FIDDLE imaging procedure can be seen by comparing the sample images shown in FIGS. 19A and 19B. The cardiac FIDDLE image shown in FIG. 19A was obtained using a conventional FIDDLE imaging procedure as illustrated in FIG. 18A. Several artifacts (indicated by the arrows) can be seen in this image. These artifacts result from misregistration errors between the IR-DA and REF image datasets.

The FIDDLE image in FIG. 19B was acquired using the exemplary sequence shown in FIG. 18B in accordance with embodiments of the present disclosure. It can be seen that this image is devoid of the misregistration artifacts that are apparent in FIG. 19A. Thus, embodiments of the disclosure can be used in a variety of cardiac imaging procedures to improve image quality, e.g., by reducing misregistration between datasets and reducing or eliminating the associated artifacts.

All embodiments of the disclosure described to this point in detail include an inversion pulse as a magnetic preparation for generating inversion recovery (IR) signals that can be used to generate images. In further embodiments, MR imaging sequences can be provided using other magnetization preparations, which can provide similar benefits such as, e.g., improvements in image quality, reduction in misregistration artifacts, and potential reduction in scan times. Such magnetization preparations can be, e.g., conventional T2 preparations, magnetization transfer preparations, T1rho, or T2rho preparations.

While the embodiments described in detail to this point generally refer to cardiac MRI (i.e., imaging of the heart itself), these various embodiments can also be applied to MRI of extra-cardiac tissues that are susceptible to cardiac pulsatile motion in further embodiments. For example, in diffusion-weighted imaging of the liver, cardiac pulsatile motion can result in significant motion artifacts. In any tissue that is affected by cardiac pulsatile motion, embodiments of the present disclosure can be used to mitigate the effects of such pulsatile motion during magnetic resonance imaging, thereby reducing or eliminating motion artifacts to improve image quality.

The foregoing merely illustrates the principles of the present disclosure. Various modifications and alterations to the described embodiments will be apparent to those skilled in the art in view of the teachings herein. It will thus be appreciated that those skilled in the art will be able to devise numerous techniques which, although not explicitly described herein, embody the principles of the present disclosure and are thus within the spirit and scope of the present disclosure.

What is claimed is:

1. A method for phase-sensitive magnetic resonance imaging of tissue affected by cardiovascular pulsatile motion, comprising:
   generating a magnetically-prepared image dataset and a corresponding phase reference image dataset, wherein generating the magnetically-prepared image dataset comprises providing an inversion pulse and an inversion recovery data acquisition sequence, wherein generating the corresponding phase reference image dataset comprises providing a reference data acquisition sequence, wherein the magnetically-prepared image dataset and the corresponding phase reference image dataset are both generated within a time interval equal to the duration of a single cardiac cycle, and wherein the magnetically-prepared image dataset and the corresponding reference image dataset are each acquired when the heart has substantially the same shape.

2. The method of claim 1, wherein the magnetically-prepared image dataset and the corresponding reference image dataset are generated within the same cardiac cycle.

3. The method of claim 1, wherein the inversion recovery data acquisition sequence and the reference data acquisition sequence are provided within consecutive cardiac cycles.

4. The method of claim 1, wherein the magnetically-prepared image dataset and the corresponding reference image dataset are generated using a single-shot acquisition technique.

5. The method of claim 1, wherein the magnetically-prepared image dataset and the corresponding reference image dataset are generated using a segmented acquisition technique.

6. The method of claim 1, wherein the inversion recovery data acquisition sequence is provided prior to the reference data acquisition sequence.

7. The method of claim 1, wherein the inversion recovery data acquisition sequence is provided after the reference data acquisition sequence.

8. The method of claim 1, wherein each of the magnetically-prepared image dataset and the corresponding phase reference image dataset is obtained at least one of during early-mid diastole or during late diastole.

9. The method of claim 1, further comprising providing a navigator sequence associated with each magnetically-prepared image dataset and corresponding reference image dataset.

10. The method of claim 1, further comprising providing a saturation pulse prior to providing the reference data acquisition sequence.

11. The method of claim 1, wherein each of the inversion recovery data acquisition sequence and the reference data acquisition sequence is at least one of a gradient recalled echo (GRE) sequence or a steady-state free precession (SSFP) sequence.

12. The method of claim 1, wherein each of the inversion recovery data acquisition sequence and the reference data acquisition sequence is a 2D readout sequence.

13. The method of claim 1, wherein each of the inversion recovery data acquisition sequence and the reference data acquisition sequence is a 3D readout sequence.

14. The method of claim 1, wherein a magnetic preparation used to obtain the magnetically-prepared image dataset comprises at least one of a T2 preparation, a magnetization transfer preparation, a T1-rho preparation, a T2-rho preparation, or a flow-independent dark-blood delayed enhancement (FIDDLE) technique preparation.

15. A magnetic resonance imaging system for phase-sensitive magnetic resonance imaging of tissue affected by cardiovascular pulsatile motion, comprising:

a radio frequency (RF) signal generator and a magnetic field gradient generator which are together configured to provide a series of RF pulse and magnetic field gradient sequences for acquisition of image data; and an image processing unit configured to reconstruct a magnetic resonance image of at least a portion of the tissue based on the image data, wherein the image data comprises a magnetically-prepared image dataset and a corresponding reference image dataset, wherein generating the magnetically-prepared image dataset comprises providing an inversion pulse and an inversion recovery data acquisition sequence, wherein generating the corresponding phase reference image dataset comprises providing a reference data acquisition sequence, wherein the system is configured to generate both the magnetically-prepared image dataset and the corresponding reference image dataset within a time interval equal to the duration of a single cardiac cycle, and wherein the magnetically-prepared image dataset and the corresponding reference image dataset are each acquired when the heart has substantially the same shape.

16. The magnetic resonance imaging system of claim 15, wherein the system is configured to generate the magnetically-prepared image dataset and the corresponding reference image dataset within the same cardiac cycle.

17. The magnetic resonance imaging system of claim 15, wherein the system is configured to provide the inversion recovery data acquisition sequence and the reference data acquisition sequence within consecutive cardiac cycles.

18. The magnetic resonance imaging system of claim 15, wherein the system is configured to generate the magnetically-prepared image dataset and the corresponding reference image dataset using a single-shot acquisition technique.

19. The magnetic resonance imaging system of claim 15, wherein the system is configured to generate the magnetically-prepared image dataset and the corresponding reference image dataset using a segmented acquisition technique.

20. The magnetic resonance imaging system of claim 15, wherein the system is configured to provide the inversion recovery data acquisition sequence prior to providing the reference data acquisition sequence.

21. The magnetic resonance imaging system of claim 15, wherein the system is configured to provide the inversion recovery data acquisition sequence after providing the reference data acquisition sequence.

22. The magnetic resonance imaging system of claim 15, wherein each of the magnetically-prepared image dataset and the corresponding reference image dataset is obtained at least one of during early-mid diastole or during late diastole.

23. The magnetic resonance imaging system of claim 15, wherein the system is further configured to provide a navigator sequence associated with each magnetically-prepared image dataset and corresponding reference image dataset.

24. The magnetic resonance imaging system of claim 15, wherein the system is further configured to provide a saturation pulse prior to providing the reference data acquisition sequence.

25. The magnetic resonance imaging system of claim 15, wherein each of the inversion recovery data acquisition sequence and the reference data acquisition sequence comprises at least one of a gradient recalled echo (GRE) sequence or a steady-state free precession (SSFP) sequence.

26. The magnetic resonance imaging system of claim 15, wherein each of the inversion recovery data acquisition sequence and the reference data acquisition sequence is a 2D data readout sequence.

27. The magnetic resonance imaging system of claim 15, wherein each of the inversion recovery data acquisition sequence and the reference data acquisition sequence is a 3D data readout sequence.

28. The magnetic resonance imaging system of claim 15, wherein the system is further configured to generate a magnetic preparation used to obtain the magnetically-prepared image dataset, and wherein the magnetic preparation comprises at least one of a T2 preparation, a magnetization transfer preparation, a T1-rho preparation, a T2-rho preparation, or a flow-independent dark-blood delayed enhancement (FIDDLE) technique preparation.

\* \* \* \* \*